(12) United States Patent
Park

(10) Patent No.: US 6,821,344 B2
(45) Date of Patent: Nov. 23, 2004

(54) CZOCHRALSKI PULLERS INCLUDING HEAT SHIELD HOUSINGS HAVING SLOPING TOP AND BOTTOM

(75) Inventor: Jea-gun Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 10/217,635

(22) Filed: Aug. 13, 2002

(65) Prior Publication Data

US 2003/0022003 A1 Jan. 30, 2003

Related U.S. Application Data

(60) Division of application No. 09/702,503, filed on Oct. 31, 2000, now Pat. No. 6,485,807, which is a continuation-in-part of application No. 09/454,675, filed on Dec. 3, 1999, now Pat. No. 6,472,040, which is a division of application No. 08/989,591, filed on Dec. 12, 1997, now Pat. No. 6,045,610, application No. 10/217,635, which is a continuation-in-part of application No. 09/320,102, filed on May 26, 1999, now Pat. No. 6,146,459, and a continuation-in-part of application No. 09/320,210, filed on May 26, 1999, now Pat. No. 6,251,184, which is a continuation-in-part of application No. 08/989,591, filed on Dec. 12, 1997, now Pat. No. 6,045,610.

(60) Provisional application No. 60/063,086, filed on Oct. 24, 1997, and provisional application No. 60/172,352, filed on Dec. 16, 1999.

(30) Foreign Application Priority Data

Feb. 13, 1997 (KR) ............................................. 97-4291
Oct. 24, 1997 (KR) ........................................... 97-54899
Nov. 13, 1999 (KR) ........................................... 99-50467

(51) Int. Cl.$^7$ ............................................... C30B 35/00
(52) U.S. Cl. ........................ 117/217; 117/218; 117/222; 117/911
(58) Field of Search ............................ 117/217, 218, 117/222, 911

(56) References Cited

U.S. PATENT DOCUMENTS 6,379,460 B1 * 4/2002 Harada et al. ............... 117/217
6,527,859 B2 * 3/2003 Lee et al. ..................... 117/217

OTHER PUBLICATIONS

Hourai et al., *Growth Parameters Determining the Type of Grown–In Defects in Czochralski Silicon Crystals*, Proceedings of the 18$^{th}$ International Conference on Defects in Semiconductors (ICDS–18), Sendai, Japan, Jul. 1995, published in Materials Science Forum, vol. 196–201, 1995, pp. 1713–1718.

(List continued on next page.)

*Primary Examiner*—Felisa Hiteshew
(74) *Attorney, Agent, or Firm*—Myers Bigel Sibley & Sajovec

(57) ABSTRACT

A silicon wafer is provided having controlled distribution of defects, in which denuded zones having a sufficient depth inward from the surface of the wafer are combined with a high gettering effect in a bulk region of the wafer. In the silicon wafer, oxygen precipitates, which act as intrinsic gettering sites, show vertical distribution. The oxygen precipitate concentration profile from the top to the bottom surfaces of the wafer includes first and second peaks at first and second predetermined depths from the top and bottom surfaces of the wafer, denuded zones between the top and bottom surfaces of the wafer and each of the first and second peaks, and a concave region between the first and second peaks, which corresponds to a bulk region of the wafer. For such an oxygen precipitate concentration profile, the wafer is exposed to a rapid thermal annealing process in a gas mixture atmosphere containing nitrogen ($N_2$) and argon (Ar) or $N_2$ and hydrogen ($H_2$), in a donor killing step during a wafering process.

6 Claims, 22 Drawing Sheets

OTHER PUBLICATIONS

Hourai et al., *Formation Behavior of Infrared Light Scattering Defects in Silicon During Czochralski Crystal Growth*, J. Electrochem, Soc., vol. 142, No. 9, Sep. 1995, pp. 3193–3201.

Park et al., *Gate Oxide Integrity in DRAM Devices: The Influence of Substrate D–Defects*, Electrochemical Society Proceedings, vol. 95–5, pp. 457–471.

Dornberger et al., *The Dependence of Ring Like Distributed Stacking Faults on the Axial Temperature Gradient of Growing Czochralski Silicon Crystals*, Electrochemical Society Proceedings, vol. 95–4, pp. 294–305.

Park et al., *Effects of D–Defects in CZ Silicon Upon Thin Gate Oxide Integrity*, The Physics and Chemistry of SiO₂ and the Si–SiO$_2$ Interface 2, edited by Helms et al., Plenum Press, New York, pp. 289–298.

Harada et al., *Oxygen Precipitation Enhanced With Vacancies in Silicon*, Electrochemical Society, 1986, pp. 76–85.

Falster et al., *The Engineering of Silicon Wafer Material Properties Through Vacancy Concentration Profile Control and the Achievement of Ideal Oxygen Precipitation Behavior*, Electrochemical Society Proceedings, vol. 98–13, pp. 135–146.

Jacob et al., *Influence of RTP on Vacancy Concentrations*, Mat. Res. Soc. Symp. proc., vol. 490, (no month), pp. 129–134.

* cited by examiner

CZOCHRALSKI PULLERS INCLUDING HEAT SHIELD HOUSINGS HAVING SLOPING TOP AND BOTTOM

CROSS-REFERENCE TO RELATED APPLICATIONS

This application is a divisional of application Ser. No. 09/702,503, filed Oct. 31, 2000, now U.S. Pat No. 6,485,807 which is itself a continuation-in-part of application Ser. No. 09/454,675, filed Dec. 3, 1999, now U.S. Pat. No. 6,472,040 which itself is a divisional application of application Ser. No. 08/989,591, filed Dec. 12, 1997 (now U.S. Pat. No. 6,045,610) and claims the benefit of provisional application Ser. No. 60/063,086 filed Oct. 24, 1997. This application also is a continuation-in-part of application Ser. No. 09/320, 102, filed May 26, 1999, now U.S. Pat No. 6,146,459 and 09/320,210, filed May 26, 1999, now U.S. Pat. No. 6,251, 184 which are themselves continuations-in-part of the above-cited application Ser. No. 08/989,591 filed filed Dec. 12, 1997, now U.S. Pat. No. 6,045,610. This application also claims benefit of provisional application 60/172,352, filed Dec. 16, 1999. This application also claims the benefit of Korean Application Nos. 99-50467, filed Nov. 13, 1999, 97-54899, filed Oct. 24, 1997 and 97-4291, filed Feb. 13, 1997. All of the above-referenced applications are assigned to the assignee of the present application, and the disclosures of all of these applications are hereby incorporated herein by reference in their entirety.

FIELD OF THE INVENTION

This invention relates to microelectronic manufacturing methods and devices, and more particularly to silicon ingot manufacturing methods and silicon ingots and wafers manufactured thereby.

BACKGROUND OF THE INVENTION

Monocrystalline silicon, which is the starting material in fabricating semiconductor devices, is grown into a cylindrical ingot by a crystal growth technique, which is referred to as the Czochralski (CZ) technique. The ingot of monocrystalline silicon is processed into wafers via a series of wafering processes such as slicing, etching, cleaning, polishing and the like. According to the CZ technique, a seed crystal of monocrystalline silicon is immersed into molten silicon and pulled upwards, and the molten silicon is then grown into a monocrystalline ingot by slow extraction. The molten silicon is contained in a quartz crucible, and is contaminated with a variety of impurities, one of which is oxygen. At the melting temperature of silicon, the oxygen permeates the crystal lattice until it reaches a predetermined concentration which generally is determined by the solubility of oxygen in silicon at the melting temperature of silicon and by the actual segregation coefficient of oxygen in solidified silicon. The concentration of oxygen, which permeates the silicon ingot during crystal growth, is greater than the solubility of oxygen in solidified silicon at typical temperatures used in semiconductor device manufacture. As the crystal grows from the molten silicon and cools, the solubility of oxygen therein rapidly decreases, whereby oxygen is saturated in the cooled ingot. As a result, the saturated oxygen generates crystalline defects, referred to as "D-defects", in the shape of void in the ingot.

Such D-defects can cause Crystal Originated Precipitates (COPs), which are pits having a {111}-plane on the surface of the wafer, to occur during a series of wafering processes such as slicing, polishing, cleaning and the like. In particular, the COPs may be enlarged through cleaning and oxidation processes, which are performed repeatedly in fabricating integrated circuit devices. The number of COPs also may sharply increase.

FIG. 1 is a sectional view of a conventional Metal Oxide Semiconductor (MOS) transistor. Referring to FIG. 1, when the COPs at the wafer surface exist in a channel region, which is located in an active region of the semiconductor device between a source region 12 and a drain region 14 which are formed near the surface of a silicon substrate 10, a gate insulation layer 16, for electrically insulating a gate electrode 18 and the silicon substrate 10, may break down. In addition, the refresh characteristics of a memory device that uses the MOSFET may degrade. Moreover, when the COPs at the wafer surface exist in a field oxide layer, which separates active regions of the semiconductor device, impurity ions may permeate down to a bulk region below the field oxide layer during ion implantation, which may cause failure in isolation due to channeling.

Also, oxygen precipitates formed in the bulk region 10a of the wafer, which are produced by subsequent heat treatment, can act as a leakage source and can act as intrinsic gettering sites, which are capable of trapping unfavorable metal contaminants during subsequent semiconductor device manufacturing. Thus, if the concentration of oxygen in the ingot is high, the concentration of oxygen precipitates which act as the intrinsic gettering sites can increase, so that the gettering capability increases. However, if the concentration of oxygen is not sufficient, oxygen precipitates may not be produced in the bulk region, so that the gettering capability may be reduced or may not be present at all. Thus, it may be desirable to properly control the amount of oxygen precipitates distributed in the bulk region of the wafer.

In a wafer which is obtained by a conventional crystal growth and wafering process, oxygen precipitates distribute through the wafer, from the top (front side) surface of the bottom (back side) surface. In general, a Denuded Zone (DZ) 10b should be provided from the top surface to a predetermined depth, which is devoid of oxygen-related defects, such as voids, COPs, dislocations, stacking faults and oxygen precipitates. However, wafers fabricated by conventional methods may produce oxygen precipitates near the surface of the wafer, which can act as a source of leakage current.

Thus, in order to form intrinsic gettering sites in the bulk region of the wafer with a sufficient DZ near the surface of the wafer, a wafer containing a high concentration of oxygen, for example, at an initial oxygen concentration of 13 parts per million atoms (ppma) or more may be thermally processed for a long period of time by alternating the temperature between low and high levels, such that oxygen precipitates may be generated in the bulk region of the wafer, and simultaneously the oxygen precipitates present near the surface of the wafer may be out-diffused to obtain a clear DZ. In a semiconductor wafer thermally processed by this conventional technique, the oxygen precipitate concentration profile through the wafer, from the top surface to the bottom surface of the wafer, may be as illustrated in FIG. 2.

Referring to FIG. 2, both the intrinsic gettering sites in the bulk region and the sufficient DZ near the surface of the wafer can be provided by the conventional technique. However, due to the additional high-temperature thermal process for a long period of time, the wafer characteristics may degrade. For example, slippage or warpage may occur in the wafer. Moreover, the manufacturing cost may increase. Also, in such a case, metal contaminants, and particularly iron (Fe), which are trapped by the oxygen precipitates in the bulk region, may be released into the DZ by a subsequent process, so that the released contaminants can act as a leakage source.

FIG. 3 is a diagram illustrating a redrawn oxygen precipitate concentration profile of a wafer fabricated by another conventional method, which is disclosed in FIG. 1A of U.S. Pat. No. 5,401,669. In particular, FIG. 3 is the oxygen precipitate concentration profile of a wafer with respect to the depth of the wafer, resulting from a rapid thermal annealing process on a wafer carried out in a nitrogen atmosphere, and subjecting the wafer to subsequent heat treatment. However, as can be seen from FIG. 3, neither the DZ near the surface of the wafer nor sufficient oxygen precipitates in the bulk region may be obtained by this conventional method.

SUMMARY OF THE INVENTION

Embodiments of the present invention provide a silicon wafer having a controlled vertical distribution of oxygen precipitates which can act as intrinsic gettering sites. In particular, the oxygen precipitate concentration profile from the top surface, in which an active region of a semiconductor device may be formed, to the bottom surface of the silicon wafer, comprises first and second peaks at first and second predetermined depths from the top and bottom surfaces of the wafer, respectively. Also, a Denuded Zone (DZ) is included between the top surface of the wafer and the first peak and between the bottom surface of the wafer and the second peak. The oxygen precipitate concentration profile also has a concave region between the first and second peaks, which can correspond to a bulk region of the wafer.

In embodiments of the invention, the oxygen precipitate concentration profile is symmetrical with respect to a central surface of the silicon wafer that is centrally located between the top and bottom surfaces. Thus, for example, the first and second predetermined depths are the same. However, in other embodiments, the profile need not be symmetrical, such that, for example, different depths may be provided for the first and second peaks. Also, in some embodiments of the invention, the depth of the denuded zones is in the range of about 10 $\mu$m to about 40 $\mu$m from each surface of the silicon wafer, such that the active region of the semiconductor device is formed to a sufficient depth. In other embodiments, crystalline defects relating to oxygen do not exist in the DZs, while D-defects in the form of voids, having a predetermined size, as well as the oxygen precipitates, may be further present in the bulk region of the wafer at a predetermined concentration.

In other embodiments of the invention, the oxygen precipitate concentrations at the first and second peaks are at least about $1 \times 10^9$ cm$^{-3}$, and oxygen precipitate concentration in the bulk region between the first and second peaks is at least about $1 \times 10^8$ cm$^{-3}$.

Silicon wafers according to other embodiments of the present invention include a controlled distribution of oxygen precipitate nucleation centers, for example vacancies, which can produce oxygen precipitate concentration profiles described above through subsequent thermal treatment. The vacancy concentration profile comprises first and second peaks at first and second predetermined depths from the top and bottom surfaces of the wafer, respectively. Also, the vacancy concentration remains at a predetermined concentration, which is lower than a critical concentration, between the top surface of the wafer and the first peak and between the bottom surfaces of the wafer and the second peak. Finally, the vacancy concentration profile has a concave region between the first and second peaks. Symmetrical or asymmetrical profiles may be provided.

According to method embodiments of the present invention, Rapid Thermal Annealing (RTA) is performed on a silicon wafer in an atmosphere of a gas mixture comprising a gas which has a vacancy injection effect and a gas which has an interstitial silicon injection effect on the top and bottom surfaces of the silicon wafer, to generate nucleation centers, which act as oxygen precipitate growth sites during subsequent heat treatment, such that the nucleation center concentration profile from the top surface to the bottom surface of the wafer comprises first and second peaks at first and second predetermined depths from the top and bottom surfaces of the wafer, respectively. Also, the nucleation center concentration remains at a predetermined concentration, which is lower than a critical concentration, between the top surface of the wafer and the first peak and between the bottom surfaces of the wafer and the second peak. Finally, the nucleation center profile has a concave region between the first and second peaks, which corresponds to a bulk region of the wafer. Symmetrical or asymmetrical profiles may be provided.

According to other method embodiments, heat treatment is performed after the RTA to produce an oxygen precipitate concentration profile from the top surface to the bottom surface of the wafer, which comprises first and second peaks at first and second predetermined depths from the top and bottom surfaces of the wafer, respectively, a DZ between the top surfaces of the wafer and the first peak and between the bottom surface of the wafer and the second peak, and a concave region between the first and second peaks. Symmetrical or asymmetrical profiles may be provided.

In other embodiments of the invention, the gas mixture comprises nitrogen ($N_2$) gas and argon (Ar) gas, or nitrogen ($N_2$) and hydrogen ($H_2$) gas. Also, in embodiments of the invention, the oxygen precipitate concentrations in the first and second peaks and in the bulk region, and/or the depths of the denuded zones may be controlled by adjusting at least one of the mixing ratio, the flow rate of the gas mixture, the ramp-up rate, the annealing temperature, the annealing time and the ramp-down rate of the RTA process.

In embodiments of the invention, a silicon wafer that is subject to an RTA process according to embodiments of the present invention may be manufactured from an ingot which is pulled from molten silicon in a hot zone furnace according to an ingot pulling rate profile where the pulling rate of the ingot is high enough so that formation of interstitial agglomerates is prevented, but low enough so that formation of vacancy agglomerates is limited to within a vacancy-rich region around the central axis of the ingot.

In other embodiments of the invention, a silicon wafer that is subject to an RTA process according to embodiments of the present invention may be manufactured from an ingot which is pulled from molten silicon in a hot zone furnace according to an ingot pulling rate profile where the pulling rate of the ingot is high enough so that formation of interstitial agglomerates is prevented, but low enough so that formation of interstitial agglomerates is prevented, and the formation of vacancy agglomerates is prevented.

In still other embodiments of the invention, a silicon wafer that is subject to an RTA process according to embodiments of the present invention may be manufactured from an ingot which is pulled from a molten silicon in a hot zone furnace according to an ingot pulling rate profile, where the pulling rate of the ingot is high enough so that vacancy agglomerates are formed through the diameter of the ingot without forming interstitial agglomerates.

According to other embodiments of the invention, a Czochralski puller for growing a monocrystalline silicon ingot includes a chamber enclosure, a crucible in the chamber enclosure that holds molten silicon, a seed holder in the chamber enclosure adjacent the crucible to hold a seed crystal, and a heater in the chamber enclosure surrounding the crucible. A ring-shaped heat shield housing also is provided in the chamber enclosure including inner and outer heat shield housing walls that are separated from each other, and a heat shield housing top and a heat shield housing bottom which connect the inner and outer heat shield housing walls, the heat shield housing top sloping upwards from the inner heat shield housing wall to the outer heat shield housing wall, and the heat shield housing bottom sloping downwards from the inner heat shield housing wall to the outer heat shield housing wall. A support member supports the heat shield housing within the crucible.

Czochralski pullers according to embodiments of the invention also pull the seed holder from the crucible to grow the molten silicon into the cylindrical monocrystalline silicon ingot, which grows along and around its central axis in a cylindrical shape and forms an ingot-molten silicon interface with the molten silicon. At least one of the lengths of the inner and outer heat shield housing walls of the heat shield housing, the slope angles of the heat shield housing top and bottom, the distance between the ingot and the inner heat shield housing wall, the distance between the crucible and the outer heat shield housing wall, the distance between the molten silicon and the inner heat shield housing wall and the location of the heat shield plate are selected such that the pulled ingot is cooled at a rate of at least 1.4° K./min based on the temperature of the ingot at the center thereof, from the temperature at the ingot-molten silicon interface to a predetermined temperature of the ingot.

Thus, according to embodiments of the present invention, a wafer is exposed to RTA in an atmosphere of a gas mixture comprising a gas which provides an interstitial injection effect and a gas which provides a vacancy injection effect on the wafer, resulting in the profile of oxygen precipitate nucleation centers which has two peaks at predetermined depths from each of the surfaces of the wafer.

Also, embodiments of RTA processes according to the present invention are performed in an atmosphere of a gas which provides the interstitial injection effect to the wafer surface, so that although voids such as D-defects may exist in the wafer, the D-defects can be dissolved within the depths of the DZs, to allow a clear active region to be provided in a semiconductor device.

In addition, embodiments of Czochralski pullers according to the present invention can rapidly cool the pulled ingot, so that the size of voids, which may be formed during ingot growth, can be made smaller. Such small voids, which are present in the DZs, can be dissolved via the RTA process according to embodiments of the present invention, while voids remain in the bulk region of the wafer.

DETAILED DESCRIPTION OF THE PREFERRED EMBODIMENT

Figure 1:
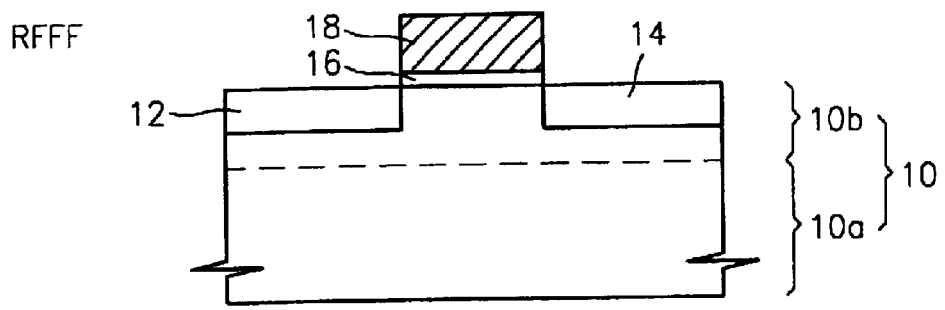
FIG. 1 is a sectional view showing a structure of a conventional Metal Oxide Semiconductor (MOS) transistor formed near the surface of a silicon wafer.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
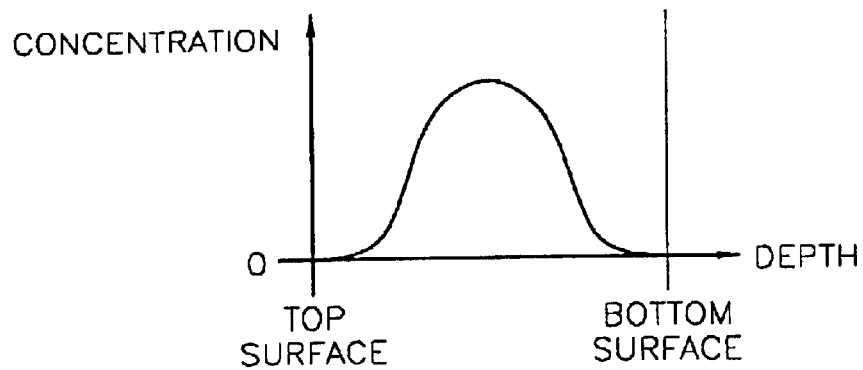
FIG. 2 is a diagram illustrating an oxygen precipitate concentration profile of a conventional wafer.
Figure 3:
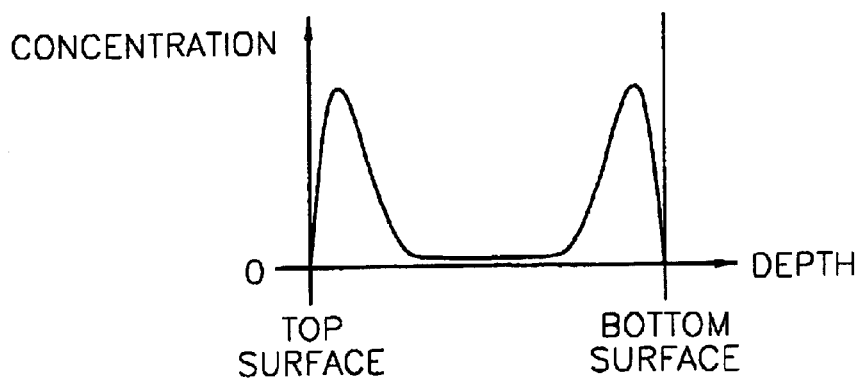
FIG. 3 is a diagram illustrating an oxygen precipitate concentration profile of another conventional wafer.
Figure 4:
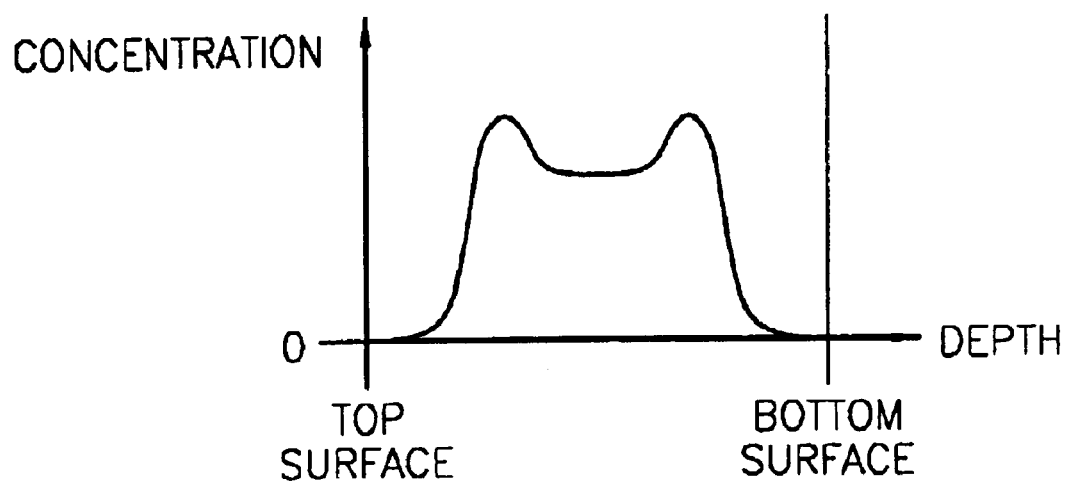
FIG. 4 shows an oxygen precipitate concentration profile of a silicon wafer according to embodiments of the present invention.

FIG. 4 schematically shows an oxygen precipitate concentration profile of a silicon wafer according to embodiments of the present invention. Comparing this profile to the oxygen precipitate concentration profiles of the silicon wafers manufactured by the conventional techniques, which are shown in FIGS. 2 and 3, there exist Denuded Zones (DZs) in a predetermined depth range from both the top and bottom surfaces of the wafer, and the oxygen precipitate concentration forms double peaks at the boundaries between each DZ and a bulk region. Also, in the bulk region between the double peaks, a large amount of oxygen precipitates are present, which are enough to produce a gettering effect on metal contaminants.

Figure 5:
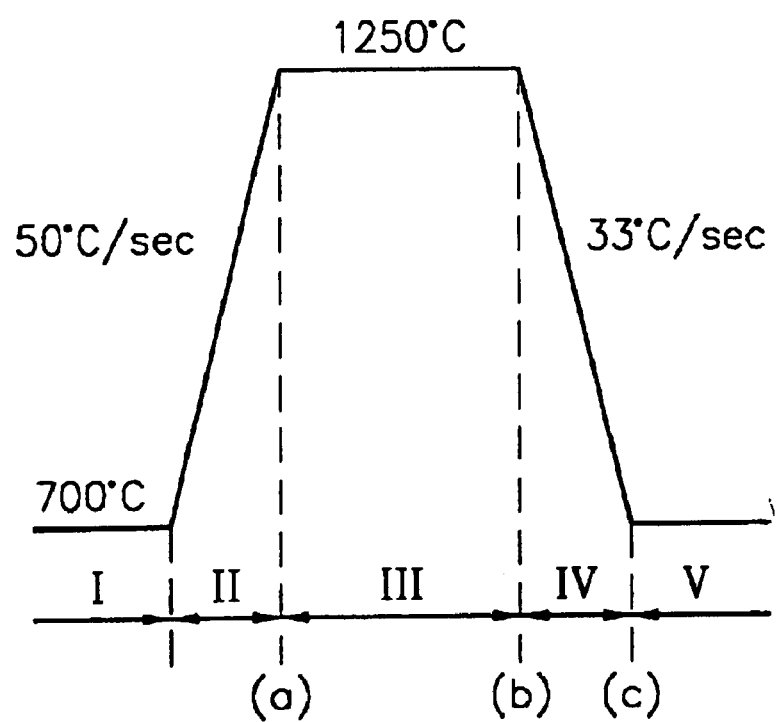
FIG. 5 is a time chart for a Rapid Thermal Annealing (RTA) process according to embodiments of the present invention.

FIG. 5 is a time chart for a Rapid Thermal Annealing (RTA) process according to embodiments of the present invention. A commercially available RTA furnace may be used. In the RTA process, first a silicon wafer according to the present invention is loaded into the RTA furnace, the temperature of which is set at, for example, about 700° C., for a standby period (I). Then, the temperature in the RTA furnace is rapidly increased, for example, at a rate of about 50° C./sec to a temperature of about 1250° C. (II). Then, the temperature is maintained at 1250° C. for a predetermined period of time, for example, about 10 seconds (III), and the temperature in the RTA furnace is sharply decreased at a rate of about 33° C./sec up to the temperature of the standby period (IV). Finally, the wafer is unloaded from the RTA furnace (V). By embodiments of the RTA process illustrated in FIG. 5, the distribution of the oxygen precipitate nucleation centers can be controlled, and voids or Crystal Originated Precipitates (COPs), which are present near the surface of the wafer, can be dissolved, as will be described later with reference to FIG. 11.

The processing temperature range of FIG. 5 is merely illustrative. However, in RTA according to embodiments of the present invention, the kinds of ambient gases, flow rates of ambient gases, mixing ratio of ambient gases, ramp-up rate, annealing temperature, annealing time and/or ramp-down rate (i.e., cooling rate) all may contribute to attaining a profile according to FIG. 4, as will be described below. The RTA is carried out at at least about 1150° C. for at least about 5 seconds. For example, the RTA is performed at 1150° C. for at least 30 seconds, or at 1250° C. for at least 5 to 10 seconds. Also, the wafer is cooled rapidly at a rate of at least 30° C./sec.

A gas mixture containing a gas which provides a vacancy injection effect to the surface of the wafer, and a gas which provides an interstitial silicon injection effect, is used as a gas for the RTA according to embodiments of the present invention. In some embodiments, nitrogen ($N_2$) gas is used as the gas which has the vacancy injection effect, and argon (Ar) and/or hydrogen ($H_2$) gas is used as the gas which has the interstitial silicon injection effect.

Figure 6:
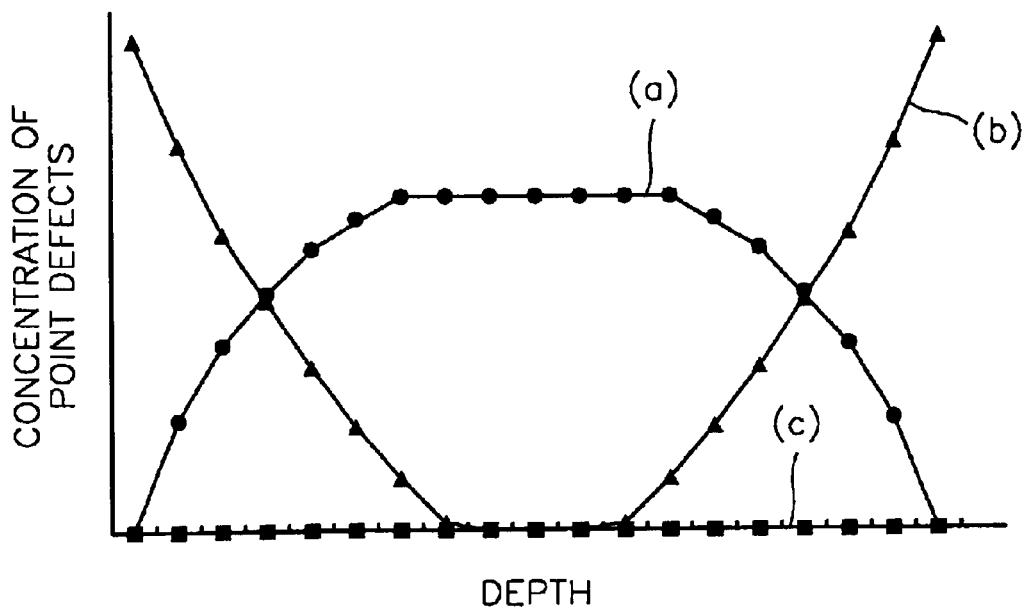
FIG. 6 shows a point defect concentration profile with respect to the depth of a wafer, after an RTA process illustrated in FIG. 5 is carried out in a nitrogen ($N_2$) gas atmosphere.
Figure 7:
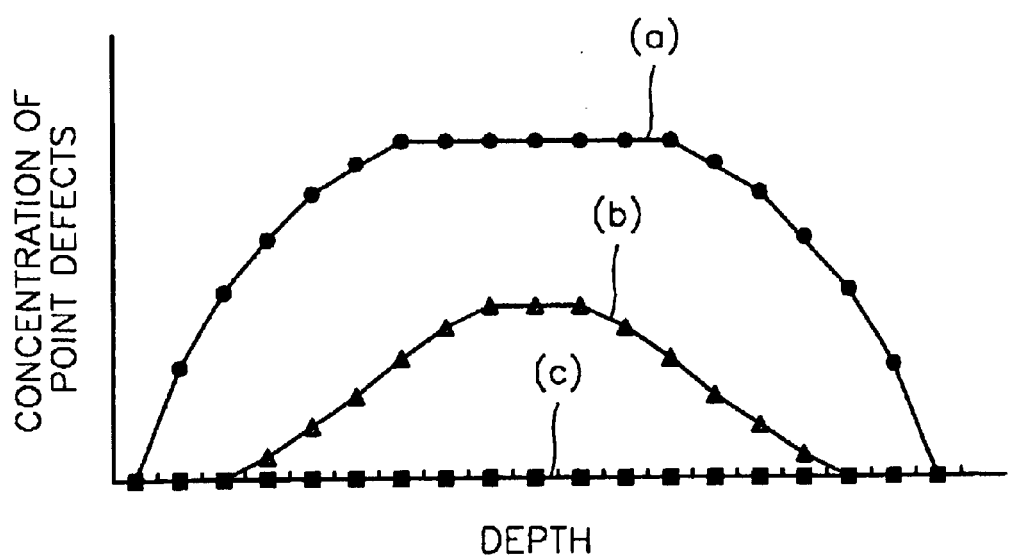
FIG. 7 shows a point defect concentration profile with respect to the depth of wafer, after an RTA process illustrated in FIG. 5 is carried out in an argon (AR) gas atmosphere.
Figure 8:
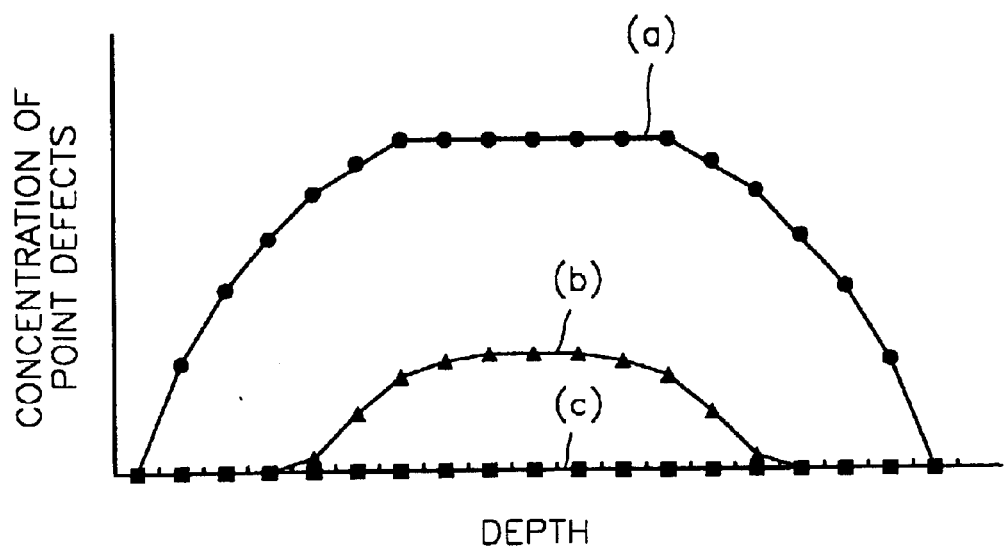
FIG. 8 shows a point defect concentration profile with respect to the depth of wafer, after an RTA process illustrated in FIG. 5 is carried out in a hydrogen ($H_2$) gas atmosphere.

FIGS. 6 through 8 illustrate the point defect concentration profiles of vacancy defects and interstitial silicon defects with respect to the depth of the wafer, after the RTA illustrated in FIG. 5 is carried out in N₂, Ar and H₂ atmospheres, respectively. In FIGS. 6 through 8, the plot (a) represents the vacancy point defect concentration profile after RTA in an inert gas atmosphere, and plots (b) and (c) represent the vacancy and interstitial point defect concentration profiles, respectively, after the RTA in the corresponding gas atmosphere.

As shown in the embodiments of FIGS. 6 through 8, the vacancy point defect concentration (convex curve indicated by (a)) after the RTA in the inert gas atmosphere was low at the top and bottom surfaces of the wafer, and was high in the bulk region of the wafer. When the temperature of the RTA furnace is rapidly increased to the temperature at the point (a) of FIG. 5 in the inert gas atmosphere, the equilibrium concentration of vacancies, which exist as point defects in the wafer, increases. Since the mobility of vacancies is low in the bulk region of the wafer, the vacancy concentration remains lower than the equilibrium concentration in the bulk region. However, the movement of vacancies is active near the surface of the wafer, so that the concentration of vacancies near the surface of the wafer reaches the equilibrium concentration, rapidly. On the other hand, as the temperature of the RTA furnace sharply increases, the equilibrium concentration of the interstitial silicon is lowered, for example by Frenkel recombination between vacancy and interstitial silicon, with the increase in the vacancy concentration. Also, since the mobility of the interstitials present in the bulk region of the wafer is low, like the vacancies therein, the interstitial concentration in the bulk region remains higher than the equilibrium concentration. However, the interstitial concentration near the surface of the wafer reaches the equilibrium concentration, as does the vacancy concentration near the surface of the wafer.

When the wafer is held at the high temperature for a period of time up to the point (b) of FIG. 5, diffusion occurs such that both vacancies and interstitials reach the equilibrium concentrations. After the wafer is rapidly cooled down to the temperature of the point (c) of FIG. 5, the interstitial point defects, which have a large diffusion coefficient, reach a new equilibrium concentration at the reduced temperature. However, the vacancy point defects, which have a small diffusion coefficient, become supersaturated in the wafer. In particular, the degree of supersaturation of vacancies is high in the bulk region of the wafer. However, because the mobility of the vacancies is high near the surface of the wafer, the concentration of vacancy point defects immediately reaches a new equilibrium concentration at the dropped temperature.

Thus, the vacancy concentration profile after the RTA in the inert atmosphere can have the convex shape as shown in FIGS. 6 through 8.

Also, as shown in FIG. 6, in the case where the RTA of FIG. 5 is performed in an N₂ gas atmosphere, N₂ gas which permeates into the bulk region of the wafer combines with vacancy silicon to produce smaller-sized silicon nitride (Si₃N₄), so that the vacancy concentration in the bulk region is lowered. Meanwhile, the vacancy concentration increases near the surface of the wafer due to the vacancy injection effect by the N₂ gas. As a result, the vacancy concentration profile in the N₂ atmosphere has the opposite shape (plot indicated by "b") to that of the wafer fabricated in the inert atmosphere.

In addition, when the RTA process of FIG. 5 is performed in the Ar and H₂ gas atmospheres as shown in FIGS. 7 and 8, respectively, the vacancy concentration is lowered throughout the wafer due to the interstitial silicon injection effect. In particular, since a recombination of vacancy silicon and interstitial silicon rapidly occurs near the surface of the wafer due to the interstitial silicon injection effect of the gases used, the vacancy concentration can be maintained at a critical concentration, which is the equilibrium concentration at a particular temperature.

Figure 9:
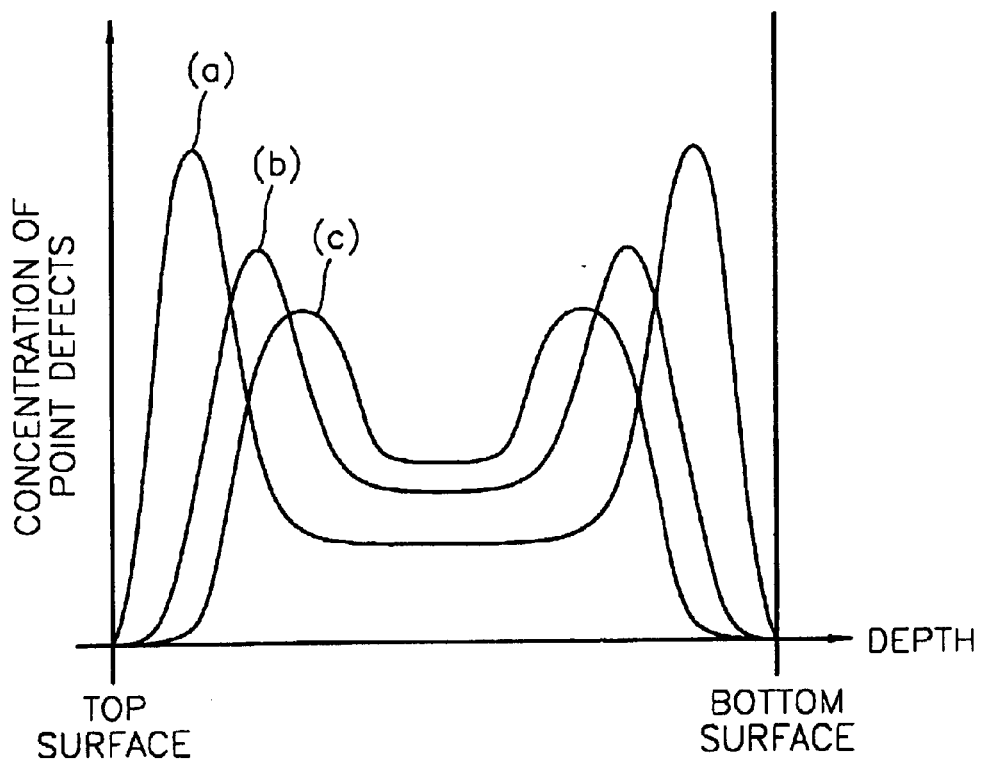
FIG. 9 shows a vacancy concentration profile after an RTA process of FIG. 5 with respect to a variation of the mixing ratio of a gas mixture containing $N_2$ gas and Ar gas.

In embodiments of the invention, the RTA of FIG. 5 is performed in a gas mixture atmosphere, for example, N₂ and Ar gases or N₂ and H₂ gases, and thus the vacancy concentration profiles in the gas mixture atmospheres can be obtained by combining those of FIGS. 6 and 7, and those of FIGS. 6 and 8. As shown in FIG. 9, the vacancy concentration profiles of the wafers fabricated in the gas mixture atmospheres show first and second peaks at a predetermined depth from the top and bottom surfaces of the silicon wafer. Also, it can be noted that the vacancy concentration from the top and bottom surfaces to the first and second peaks is lower than the equilibrium concentration at a particular temperature. Also, in the bulk region between the first and second peaks, the vacancy concentration profiles have a concave shape.

The vacancy concentration profile of FIG. 9 can be obtained according to embodiments of the invention, because the RTA process of FIG. 5 is performed in the gas mixture atmosphere containing the gases providing the vacancy and interstitial silicon injection effects. Comparing, using a logarithmic scale, the vacancy silicon concentration profile obtained from the vacancy silicon injection effect in the N₂ gas atmosphere, to the interstitial silicon concentration profiles obtained from the interstitial silicon injection effect in Ar or H₂ gas atmosphere, the vacancy silicon concentration profile is less steep than the interstitial silicon concentration profile in the region from the top and bottom surfaces of the wafer to a predetermined depth. However, the vacancy silicon concentration profile becomes steeper than the interstitial silicon concentration profile from the predetermined depth toward the bulk region. Thus, in the denuded zone near the top and bottom surfaces of the wafers, the vacancy silicon concentration is maintained at or below a critical value, i.e., less than or equal to the equilibrium concentration value at a particular temperature, by the recombination with the interstitial silicones. Beyond the denuded zone, the vacancy silicon concentration sharply increases to be equal to and higher than the equilibrium concentration value. Then, at a depth of the wafer where the difference between the vacancy and interstitial silicon concentration values reaches a maximum value, i.e., where the vacancy silicon concentration profile becomes steeper than the interstitial silicon concentration, peaks (first and second peaks) are formed. The vacancy silicon concentration decreases beyond the peaks toward the bulk region, so that a concave vacancy concentration profile is obtained between the first and second peaks.

According to other embodiments of the invention, the vacancy point defects of the wafer generate oxygen-precipitates via thermal process cycles in subsequent semiconductor device manufacture. In other words, the vacancy point defects become nucleation centers for oxygen precipitates formed by the subsequent thermal process cycles. The higher the vacancy concentration, the higher the oxygen precipitate concentration. Thus, the oxygen precipitate concentration profile can be inferred from the vacancy concentration profile of the wafer.

The vacancy concentration and the oxygen precipitate concentration have the following relationship:

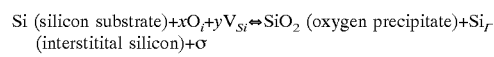

This relational expression says that as the vacancy silicon concentration ($V_{si}$) and the initial oxygen concentration ($O_i$) increase, the reaction proceeds to the right, so that the oxygen precipitate concentration increases. In the above relational expression, σ is a constant.

In embodiments of the invention, the oxygen precipitate concentration profile was obtained after subsequent heat treatment on the wafer which had undergone the RTA process of FIG. 5. The conditions for the subsequent heat treatment were determined taking into account the conditions of the thermal process cycles in semiconductor device manufacture, during which oxygen precipitates are formed. For comparison between wafers, after the RTA process of FIG. 5, the subsequent processes were carried out at about 800° C. for about 4 hours and at about 1600° C. for about 16 hours in an $N_2$ gas atmosphere.

Figure 31:
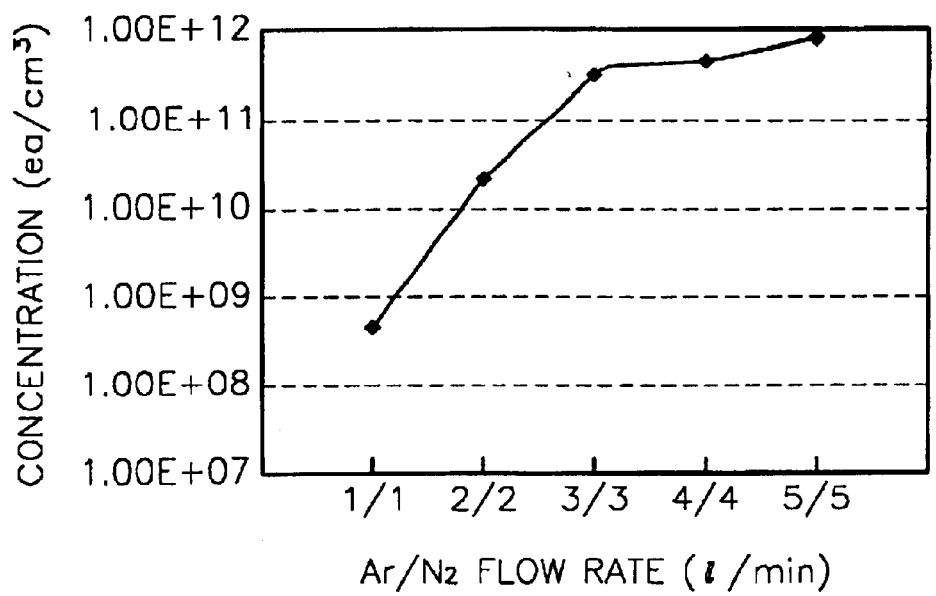
FIG. 31 is a graph showing variation of oxygen precipitate concentration at the peaks after the RTA of FIG. 5 with respect to a variation of the flow rate of $N_2$ and Ar mixture gas.

Also, in order to investigate the effect of the gas mixture used in the present invention, a flow rate and mixing ratio of the gas mixture used during the RTA process of FIG. 5 were varied. FIG. 9 shows the vacancy concentration profile after the RTA of FIG. 5 with respect to a variation of the mixing ratio of the gas mixture containing $N_2$ gas and Ar gas. FIG. 31 is a graph showing the variation in oxygen precipitant concentration at the peaks with respect to a variation of the flow rate of Ar/$N_2$ mixture gas.

In FIG. 9, (a) represents the vacancy concentration profile when the mixing ratio of $N_2$ and Ar is 70:30, (b) represents when the mixing ratio of $N_2$ and Ar is 50:50, and (c) represents when the mixing ratio of $N_2$ and Ar is 30:70. It should be noted that as the $N_2$ concentration increases, the peaks shift toward surfaces of the wafer, and the vacancy concentration of the peaks increases. That is, the depths of the DZs, where the oxygen precipitates due to the subsequent processes are not formed, sharply decreases with the increase in the $N_2$ concentration.

The oxygen precipitate concentration of FIG. 31 at the peaks was measured after a further thermal treatment at about 800° C. for about 4 hours and then at about 1600° C. for about 16 hours in an $N_2$ atmosphere after the RTA of FIG. 5 was completed. Here, the RTA was performed by flowing Ar/$N_2$ gas mixture at a ramp-up rate of about 50° C./sec, an annealing temperature of about 1250° C., an annealing time of about 10 seconds and a ramp-down rate of about 33° C./sec. The flow rates of the Ar/$N_2$ gases in the Ar/$N_2$ mixture were varied to be 1/1, 2/2, 3/3, 4/4 and 5/5 liters/min. The result of FIG. 31 shows that the oxygen precipitate concentration increases with the increase in flow rate of the mixture gas.

Figure 32:
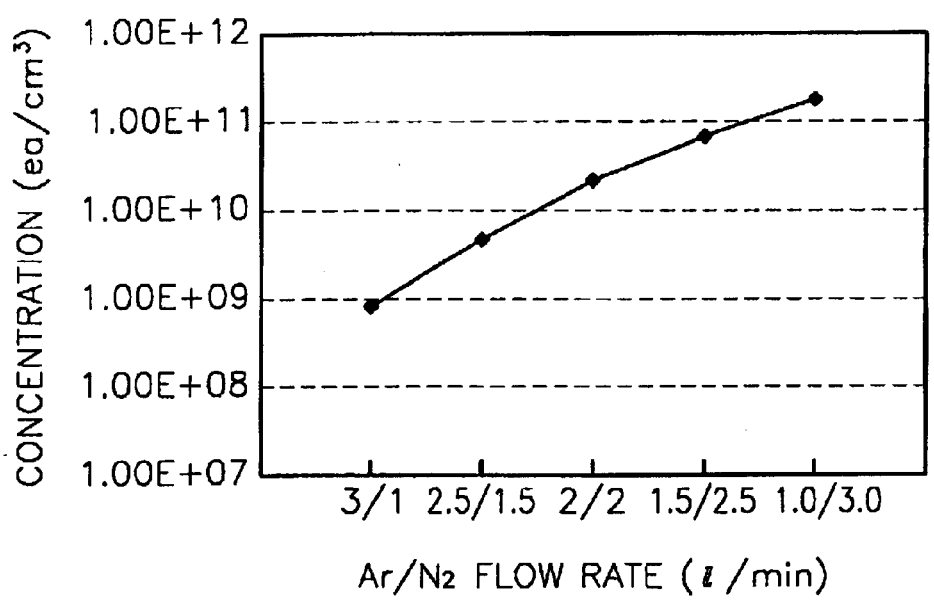
FIG. 32 is a graph showing variation of oxygen precipitate concentration at the peaks after the RTA of FIG. 5 with respect to a variation of the mixing ratio of $N_2$ and Ar mixture gas.

The oxygen precipitate concentration of FIG. 32 at the peaks was measured after the RTA was performed in the same conditions as for the data of FIG. 31 except that the Ar/$N_2$ gases in the gas mixture were supplied at a flow rate of 3/1, 2.5/1.5, 2/2, 1.5/2.5, 1/3 liters/min with various mixing ratios. After the RTA of FIG. 5, a further thermal treatment was performed at 800° C. for 4 hours and then at 1600° C. for 16 hours in a $N_2$ atmosphere. The result of FIG. 32 shows that at a constant mass flow of the gas mixture at 4 liters/min, the oxygen precipitate concentration increases with the increase in the ratio of $N_2$ in the gas mixture.

The processing conditions of the RTA, including the mixing ratio and flow rate of gas mixture, the ramp-up rate, the annealing temperature and time, the ramp-down rate and the like, can be varied at various levels to vary the positions of peaks at the vacancy concentration profile, the vacancy concentration value at the peaks, the vacancy concentration value at the bulk region, the size of denuded zone and/or the like.

Figure 33:
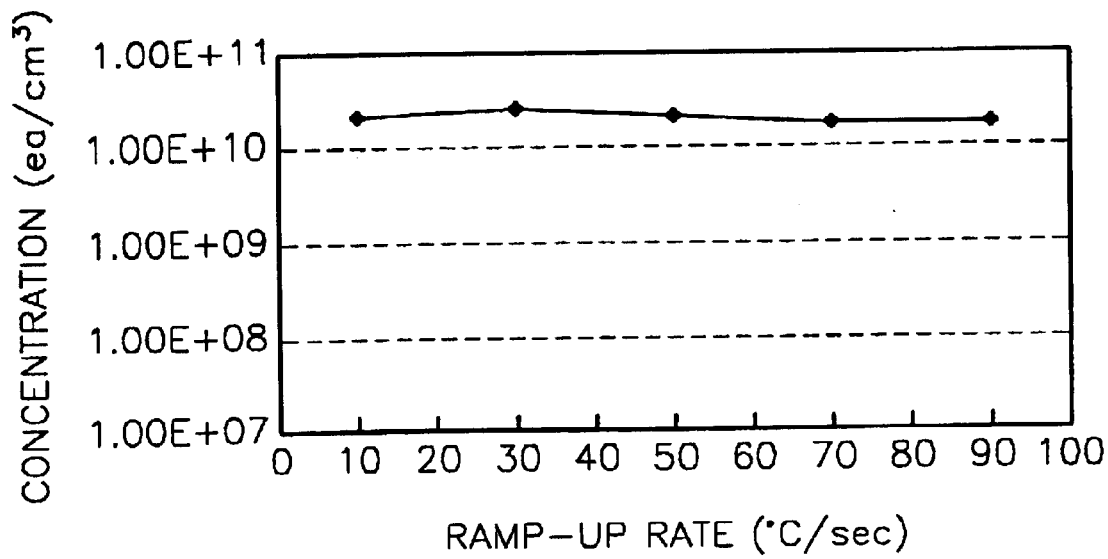
FIG. 33 is a graph showing variation of oxygen precipitate concentration at the peaks after the RTA of FIG. 5 with respect to a variation of the ramp-up rate.

FIG. 33 shows the variation of oxygen precipitate concentration at the peaks after the RTA of FIG. 5 with respect to a variation of the ramp-up rate. For comparison, the other processing conditions of the RTA were kept constant, i.e., the mixing ratio of $N_2$ and Ar gases was set to 50:50, the annealing temperature was set to 1250° C., the annealing time was set to 10 seconds and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 1.

TABLE 1

| Ramp-up rate (° C./sec) | Oxygen precipitate concentration at peaks (ea/cm$^3$) |
| --- | --- |
| 10 | 2.0 × 10$^{10}$ |
| 30 | 2.5 × 10$^{10}$ |
| 50 | 2.1 × 10$^{10}$ |
| 70 | 2.0 × 10$^{10}$ |
| 90 | 2.0 × 10$^{10}$ |

FIG. 33 and Table 1 indicate that the oxygen precipitate concentration at the peaks are not influenced greatly by the ramp-up rate.

Figure 34:
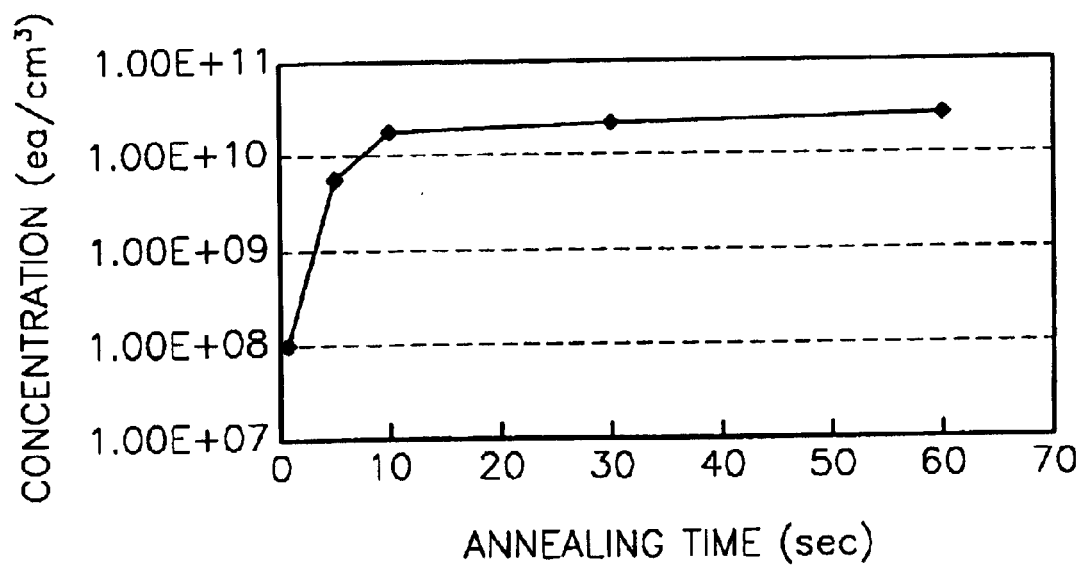
FIG. 34 is a graph showing variation of oxygen precipitate concentration at the peaks after the RTA of FIG. 5 with respect to a variation of the annealing time.

FIG. 34 shows the variation of oxygen precipitate concentration at the peaks after the RTA of FIG. 5 with respect to a variation of the annealing time. For an accurate comparison, the other processing conditions of the RTA were kept constant, i.e., the mixing ratio of $N_2$ and Ar gases was set to 50:50, the ramp-up rate was set to 50° C./sec, the annealing temperature was set to 1250 C, and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 2.

TABLE 2

| Annealing Time | Oxygen precipitate concentration at peaks (ea/cm$^3$) |
| --- | --- |
| 1 | 1.0 × 10$^8$ |
| 5 | 5.0 × 10$^9$ |
| 10 | 2.0 × 10$^{10}$ |
| 30 | 2.5 × 10$^{10}$ |
| 60 | 3.0 × 10$^{10}$ |

FIG. 34 and Table 2 indicate that the oxygen precipitate concentration at the peaks is influenced by the annealing time, and the annealing should be continued for at least 5 seconds or more for the oxygen precipitate concentration of at least 10$^9$/cm$^3$ or more at the peaks.

Figure 35:
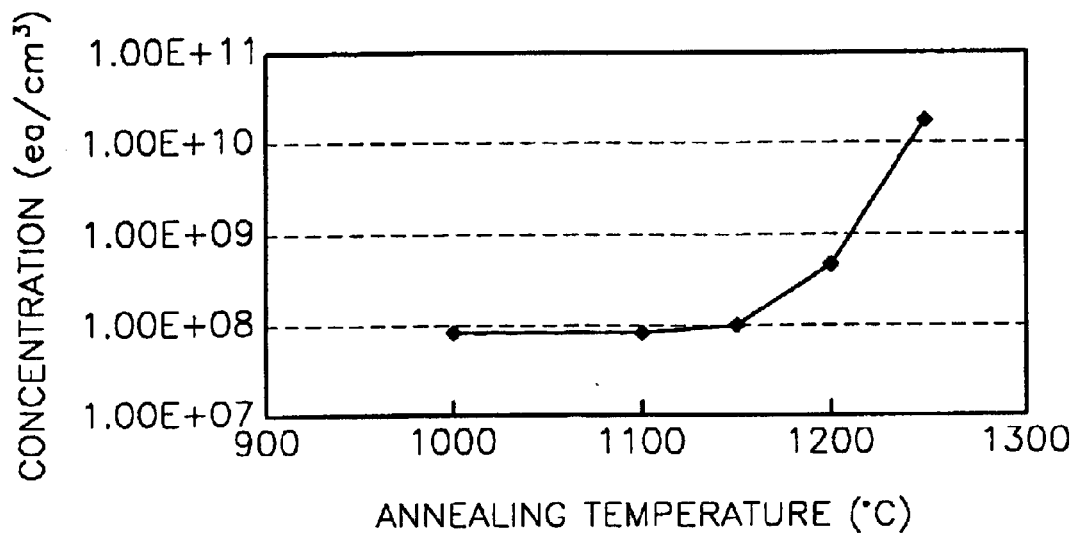
FIG. 35 is a graph showing variation of oxygen precipitate concentration at the peaks after the RTA of FIG. 5 with respect to a variation of the annealing temperature.

FIG. 35 shows the variation of oxygen precipitation concentration at the peaks after the RTA of FIG. 5 with respect to a variation of the annealing temperature. For comparison, the other processing conditions of the RTA were kept constant, i.e., the mixing ratio of $N_2$ and Ar gases was set to 50:50, the ramp-up rate was set to 50° C./sec, the annealing time was set to 10 seconds, and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 3.

TABLE 3

| Annealing Temperature | Oxygen precipitate concentration at peaks (ea/cm$^3$) |
|---|---|
| 12.50 | $2.0 \times 10^{10}$ |
| 1200 | $5.0 \times 10^{8}$ |
| 1150 | $1.0 \times 10^{8}$ |
| 1100 | $7.0 \times 10^{7}$ |
| 1000 | $7.0 \times 10^{7}$ |

FIG. 35 and Table 3 indicate that the oxygen precipitate concentration at the peaks is influenced by the annealing temperature, and the annealing temperature should be high (at at least about 1250° C. or more) for the oxygen precipitate concentration of at least $10^9$/cm$^3$ or more at the peaks. The annealing temperature and time are closely associated with the oxygen precipitate concentration. Considering the result of FIG. 34, it can be noted that for a certain concentration of oxygen precipitate, the annealing time can be reduced at a higher annealing temperature, whereas the annealing time can be lengthened at a lower annealing temperature for a certain concentration.

Figure 36:
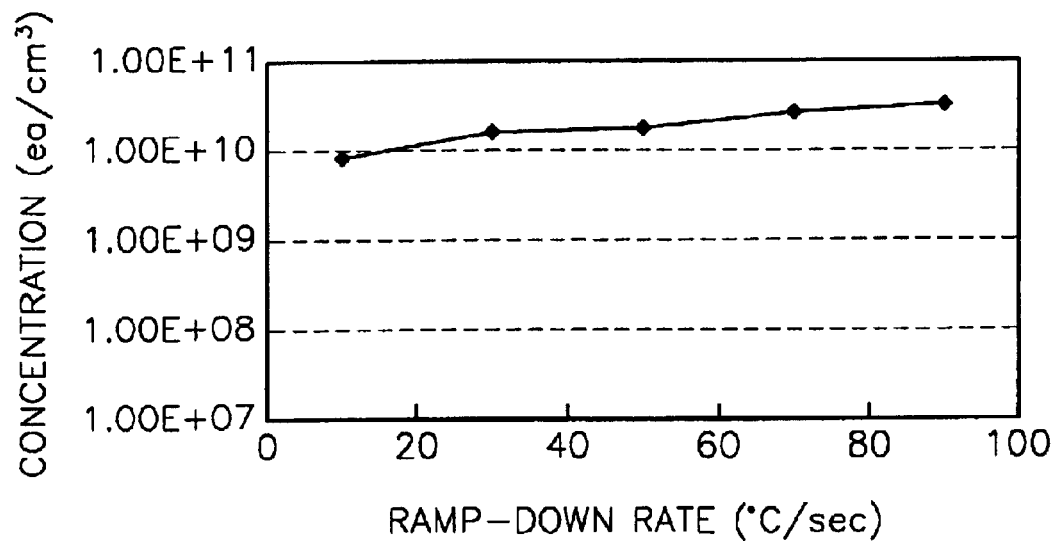
FIG. 36 is a graph showing variation of oxygen precipitate concentration at peaks after the RTA of FIG. 5 with respect to variation of ramp-down rate.

FIG. 36 shows the variation of oxygen precipitate concentration at the peaks after the RTA of FIG. 5 with respect to a variation of the ramp-down rate. For comparison, the other processing conditions of the RTA were kept constant, i.e., the mixing ratio of N$_2$ and Ar gases was set to 50:50, the ramp-up rate was set to 50° C./sec, the annealing temperature was set to 1250° C. and the annealing time was set to 10 seconds. A subsequent thermal treatment was carried out for all of the wafers at 800° C. for 4 hours and then at 1600° C. for 16 hours in a N$_2$ atmosphere, which was the same as in the previous measurements. The result is shown in Table 4.

TABLE 4

| Ramp-down rate (° C./sec) | Oxygen precipitate concentration at peaks (ea/cm$^3$) |
|---|---|
| 10 | $8.0 \times 10^{9}$ |
| 30 | $2.0 \times 10^{10}$ |
| 50 | $2.2 \times 10^{10}$ |
| 70 | $3.0 \times 10^{10}$ |
| 90 | $3.5 \times 10^{10}$ |

FIG. 36 and Table 4 indicate that the oxygen precipitate concentration at the peaks is not influenced greatly by the ramp-down rate. However, the oxygen precipitate concentration slightly increases with the increase in ramp-up rate.

Figure 10:
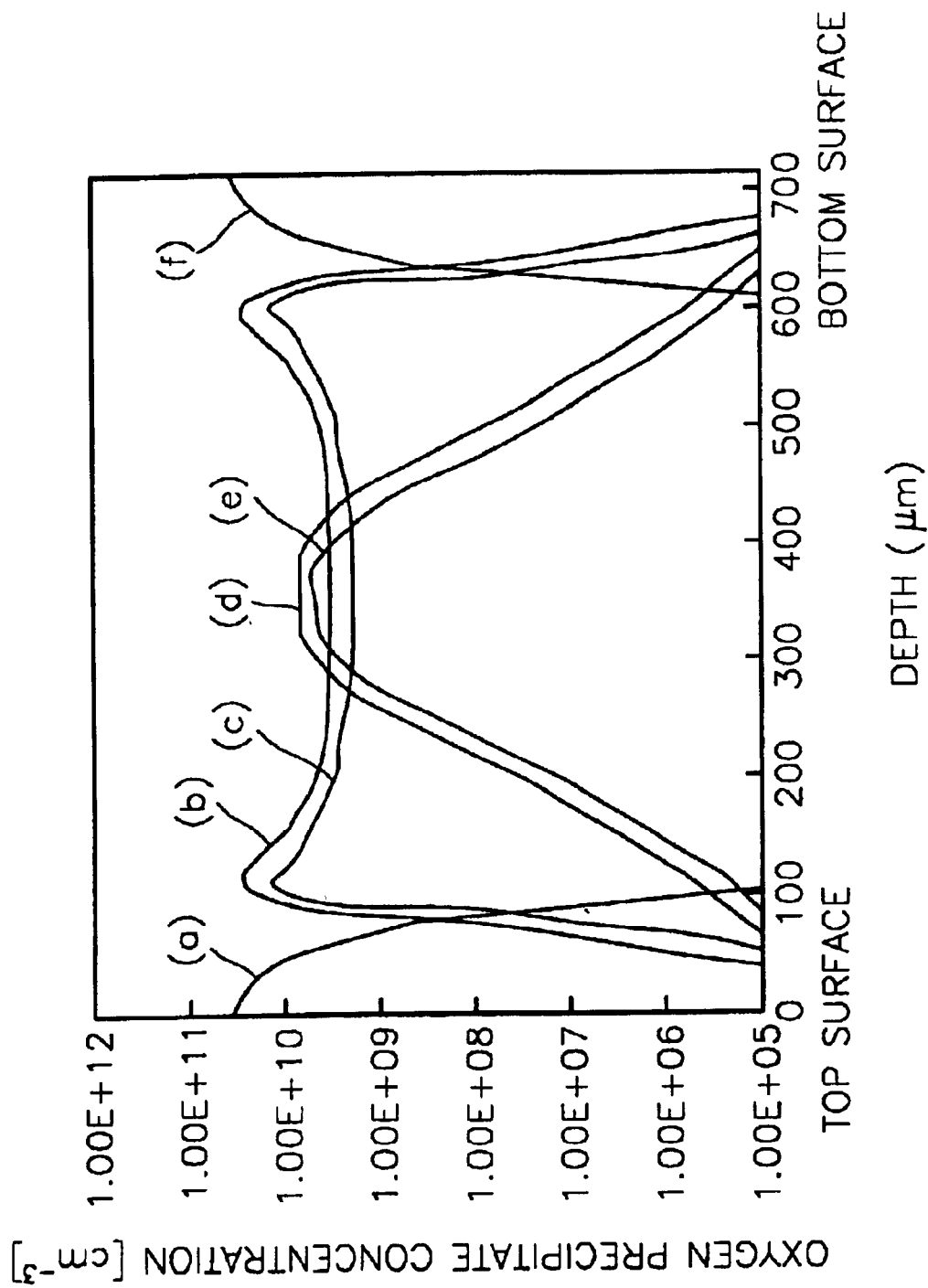
FIG. 10 shows an oxygen precipitate concentration profiles obtained through subsequent heat treatment after an RTA process according to embodiments of the present invention, with respect to the kinds of gas used during the RTA.

FIG. 10 shows the oxygen precipitate concentration profiles obtained through the subsequent heat treatment after the RTA process according to embodiments of the present invention, with respect to the kinds of gas used during the RTA. In FIG. 10, (a) represents the oxygen precipitate concentration profile of a wafer fabricated in a N$_2$ gas atmosphere, (b) represents that of a wafer fabricated in a N$_2$ gas and Ar gas atmosphere, (c) represents that of a wafer fabricated in a N$_2$ gas and H$_2$ gas atmosphere, (d) represents that of a wafer fabricated in an Ar gas atmosphere, and (e) represents that of a wafer fabricated in a H$_2$ gas atmosphere.

For comparison, the RTA and the subsequent heat treatment were carried out on all the wafers under the same processing conditions. That is, the RTA was performed at 1250° C. for 10 seconds, and the subsequent heat treatment were performed twice, as described above, at 800° C. for 4 hours and at 1600° C. for 16 hours. The results are shown in Table 5.

TABLE 5

| Gas used | peak oxygen precipitate concentration (cm$^{-3}$) | Oxygen precipitate concentration in bulk region (cm$^{-3}$) | Depths of DZs ($\mu$m) | COP dissolution ability |
|---|---|---|---|---|
| Ar | $8 \times 10^{9}$ | $8 \times 10^{9}$ | 50 | Medium |
| H$_2$ | $6 \times 10^{9}$ | $6 \times 10^{9}$ | 60 | High |
| N$_2$ | $3 \times 10^{9}$ | $\approx 1 \times 10^{5}$ (detection limit) | 0 | None |
| N$_2$ + Ar | $2 \times 10^{10}$ | $5 \times 10^{9}$ | 10 | Medium |
| N$_2$ + H$_2$ | $1 \times 10^{10}$ | $5 \times 10^{9}$ | 15 | High |

Figure 11:
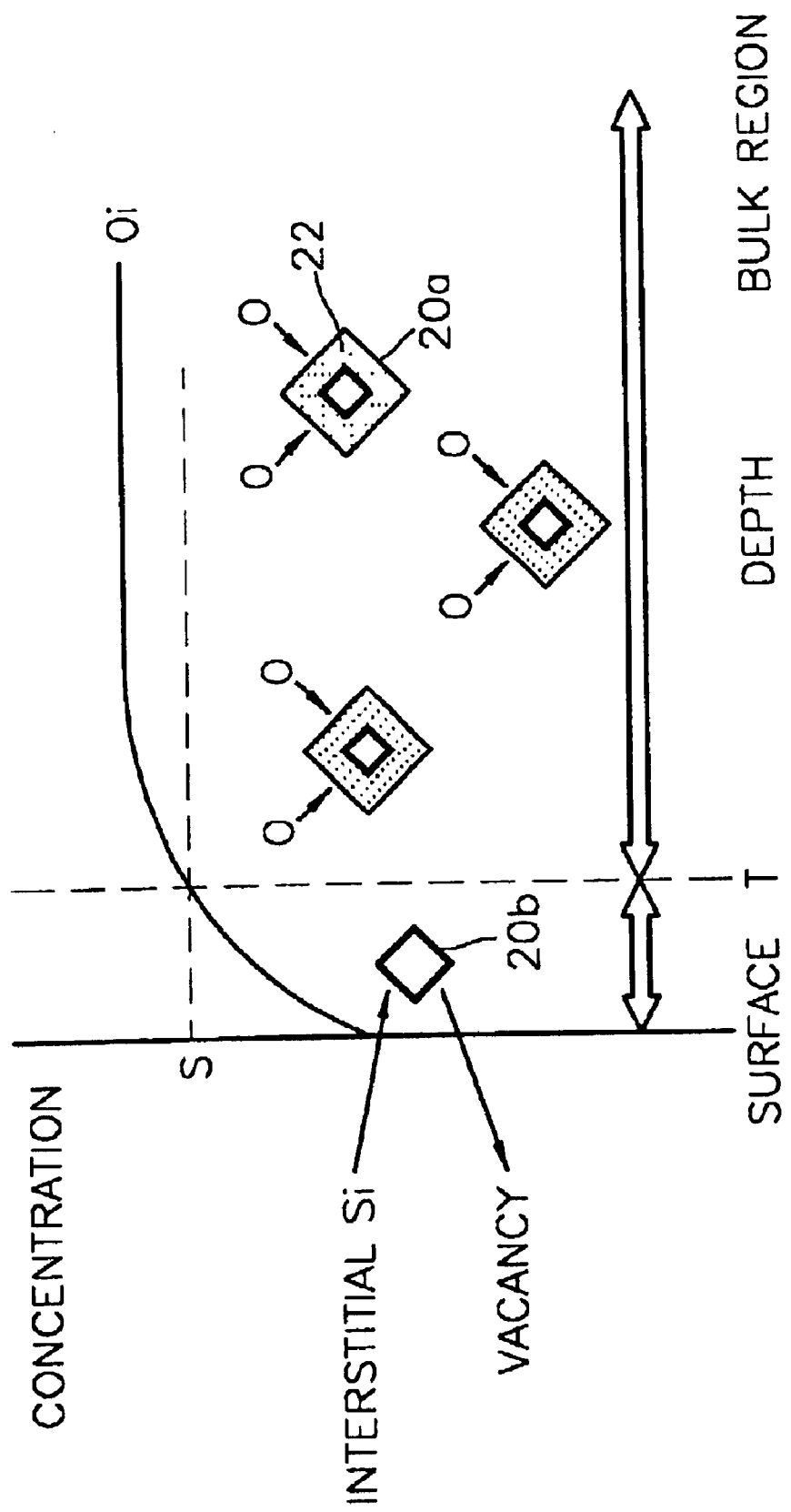
FIG. 11 is a diagram illustrating dissolution of Crystal Originated Precipitates (COPs) near the surface of the silicon wafer as the RTA of FIG. 5 is carried out in the Ar atmosphere.
Figure 12:
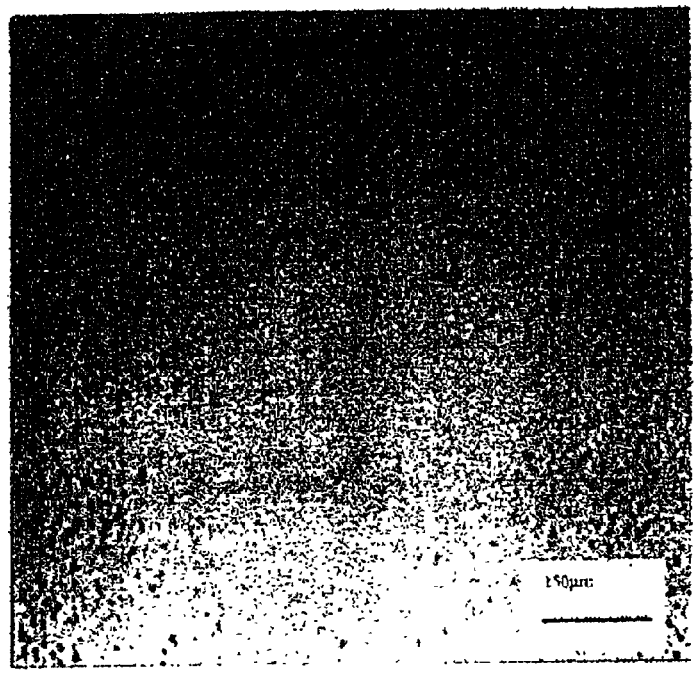
FIG. 12 is a photograph showing oxygen precipitate distribution of a wafer which has undergone a subsequent heat treatment after an RTA process according to embodiments of the invention in the $N_2$ gas atmosphere.
Figure 13:
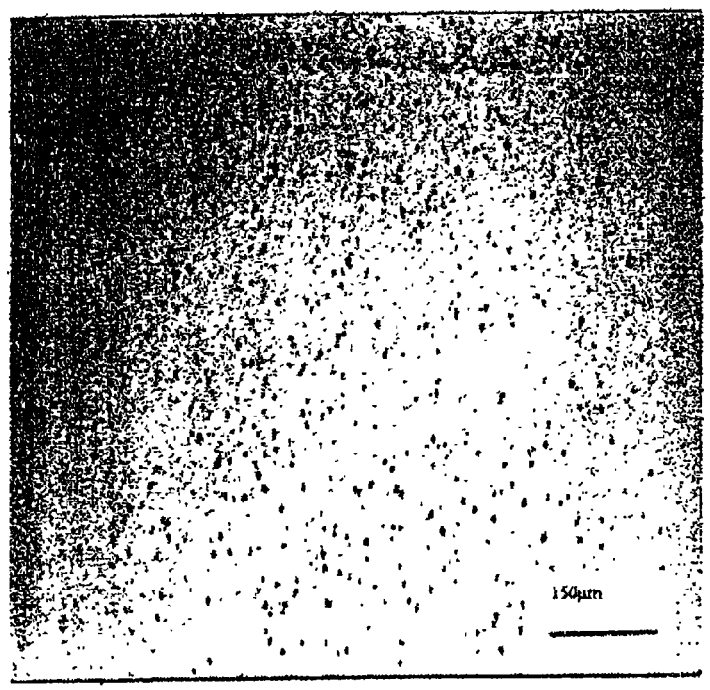
FIG. 13 is a photograph showing oxygen precipitate distribution of a wafer which has undergone a subsequent heat treatment after an RTA process according to embodiments of the invention in the Ar gas atmosphere.
Figure 14:
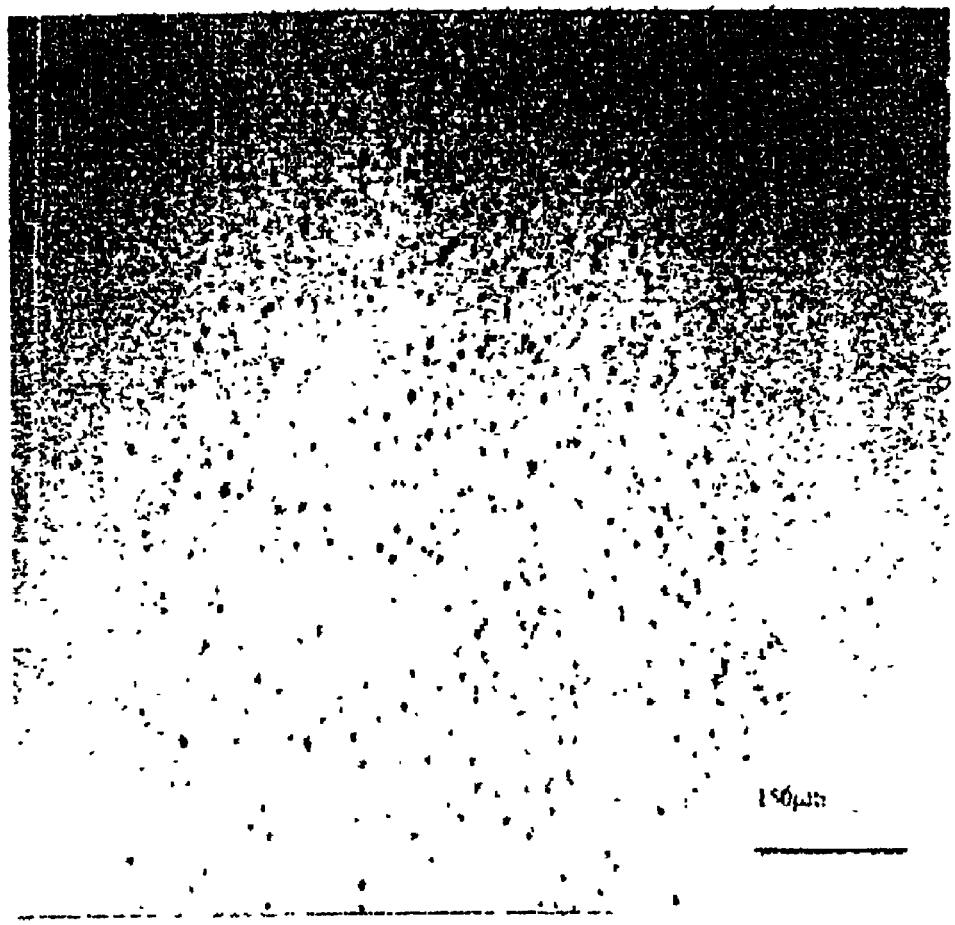
FIG. 14 is a photograph showing oxygen precipitate distribution of a wafer which has undergone a subsequent heat treatment after an RTA process according to embodiments of the invention in the $H_2$ gas atmosphere.
Figure 15:
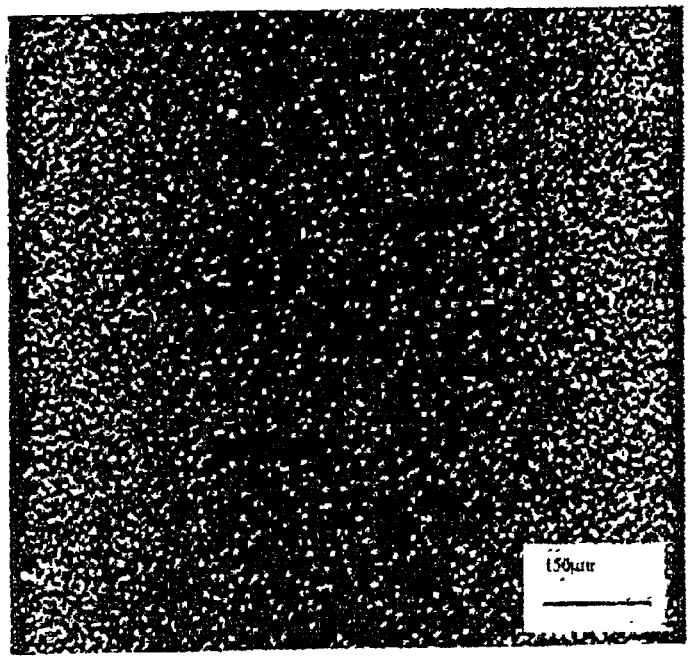
FIG. 15 is a photograph showing oxygen precipitate distribution of a wafer which has undergone a subsequent heat treatment after an RTA process according to embodiments of the invention in the $N_2$ and Ar gas atmosphere.
Figure 16:
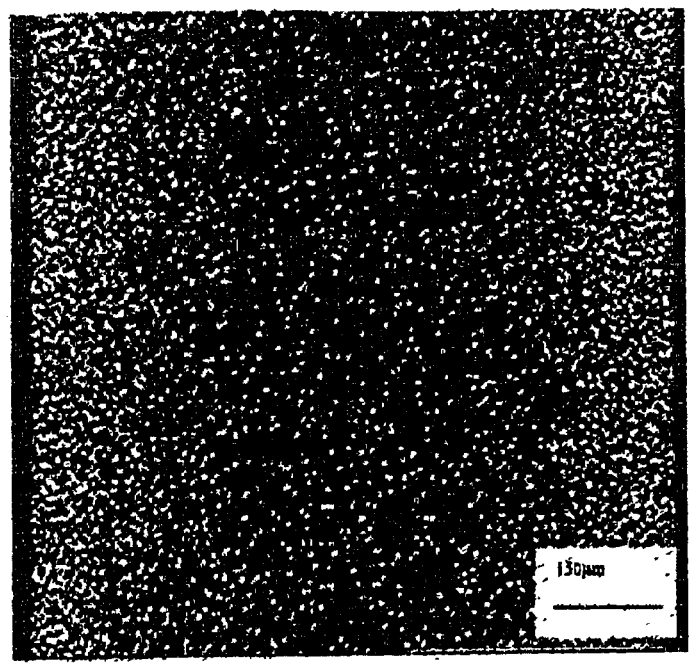
FIG. 16 is a photograph showing oxygen precipitate distribution of a wafer which has undergone a subsequent heat treatment after an RTA process according to embodiments of the invention in the $N_2$ gas and $H_2$ gas atmosphere.

FIG. 11 is a diagram illustrating dissolution of the COPs near the surface of the silicon wafer as the RTA of FIG. 5 is carried out in the Ar atmosphere. In general, the COPs which are formed during the ingot growth by the CZ technique have a broken octahedral void shape, and a silicon oxide layer 22 is formed on the inner side of a void 20a. Also, when the RTA process is performed in a Ar or H$_2$ gas atmosphere, wherein the gases provide the interstitial silicon injection effect to the surface of the wafer, the COPs, which are present near the surface of the wafer, are dissolved.

Describing a dissolution mechanism of the COPs in detail, as the ingot, in which oxygen is incorporated at the initial concentration O$_i$ during the crystal growth, is cooled, the oxygen concentration of the ingot becomes supersaturated at the cooling temperature. Thus, the initial oxygen concentration of the wafer formed from the ingot is also supersaturated beyond the predetermined solubility of oxygen (indicated by "S" in FIG. 11). However, the initial oxygen concentration near the surface of the wafer is equal to or less than the predetermined solubility "S" due to out-diffusion of oxygen through the surface of the wafer. Meanwhile, in the bulk region of the wafer, the supersaturated oxygen is supplied into the void 20a and is used to form the silicon oxide layer 22 on the inside of the void 20a. Also, since the initial oxygen concentration near the surface of the wafer (that is, a region between the surface and dashed line "T" of FIG. 11) is less than the predetermined solubility "S" of oxygen, oxygen is dissolved out of the silicon oxide layer (not shown) formed in the void 20b and simultaneously silicon is provided on the inside of the void 20b due to the interstitial silicon injection effect of the gas which is provided during the RTA process. As a result, the size of the void 20b decreases and the void 22b finally disappears.

Due to the COP dissolution effect, the RTA process according to embodiments of the present invention can be extended to many kinds of wafers. As shown in Table 5, such COP dissolution effect may be enhanced using the H$_2$ gas than using the Ar gas.

FIGS. 12 through 16 are photographs showing the oxygen precipitate distributions of the wafers which have undergone the subsequent heat treatment after the RTA, and have the oxygen precipitate concentration profiles of FIG. 10. In particular, FIG. 12 corresponds to the case of using N$_2$ gas, FIG. 13 corresponds to the case of using Ar gas, FIG. 14 corresponds to the case of using H$_2$ gas, FIG. 15 corresponds to the case of using N$_2$ and Ar gases, and FIG. 16 corresponds to the case of using N$_2$ and H$_2$ gases. Also, the left of each figure shows the top surface of the wafer, and the right thereof shows the bottom surface of the wafer.

Figure 17:
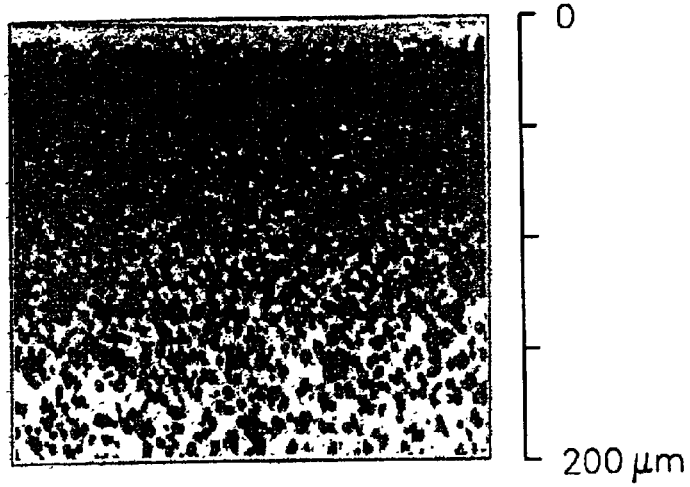
FIG. 17 is a photograph showing the depth of DZ formed near the surface of a wafer which has undergone a subsequent heat treatment after an RTA process according to embodiments of the invention in the $N_2$ gas atmosphere.
Figure 18:
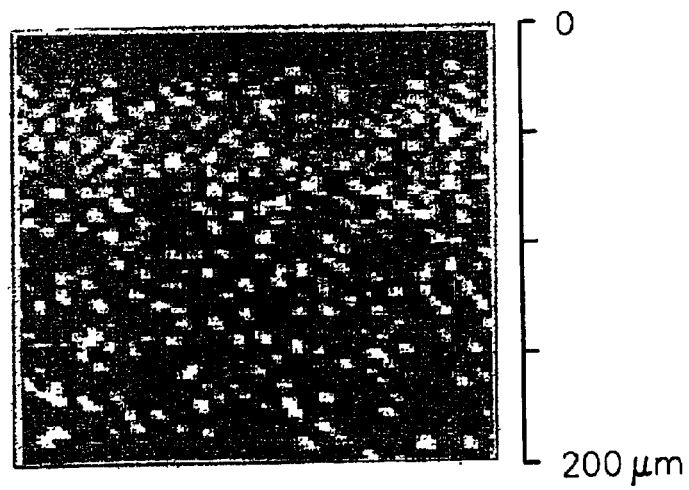
FIG. 18 is a photograph showing the depth of DZ formed near the surface of a wafer which has undergone a subsequent heat treatment after an RTA process according to embodiments of the invention in the Ar gas atmosphere.
Figure 19:
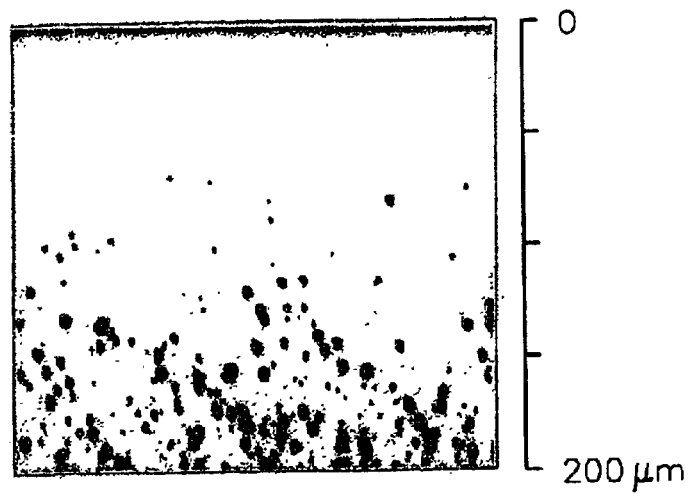
FIG. 19 is a photograph showing the depth of DZ formed near the surface of a wafer which has undergone a subsequent heat treatment after an RTA process according to embodiments of the invention in the $H_2$ gas atmosphere.
Figure 20:
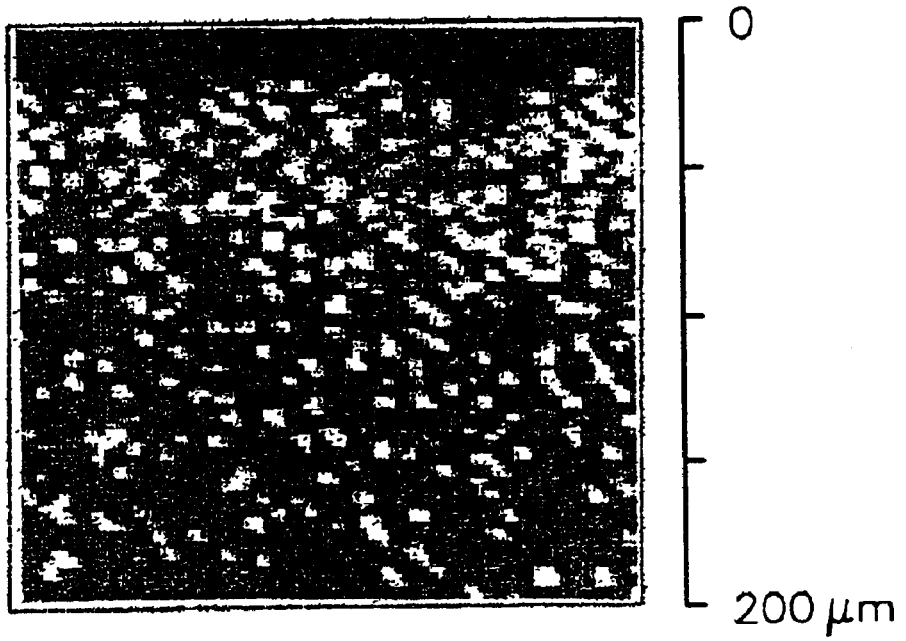
FIG. 20 is a photograph showing the depth of DZ formed near the surface of a wafer which has undergone a subsequent heat treatment after an RTA process according to embodiments of the invention in the $N_2$ gas and Ar gas atmosphere.
Figure 21:
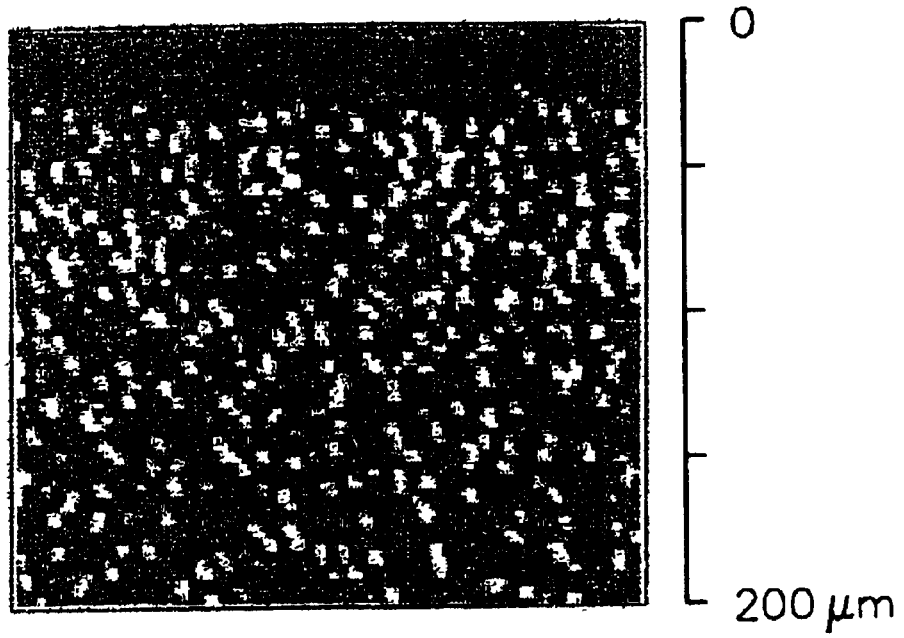
FIG. 21 is a photograph showing the depth of DZ formed near the surface of a wafer which has undergone a subsequent heat treatment after an RTA process according to embodiments of the invention in the $N_2$ gas and $H_2$ gas atmosphere.

FIGS. 17 through 21 are photographs showing the depth of DZ formed near the surface of the wafers, where no oxygen precipitates exist, which have undergone the subsequent heat treatment after the RTA, and have the oxygen precipitate concentration profiles of FIG. 10. In particular, FIG. 17 represents the case of using $N_2$ gas, FIG. 18 represents the case of using Ar gas, FIG. 19 represents the case of using $H_2$ gas, FIG. 20 represents the case of using $N_2$ and Ar gases, and FIG. 21 represents the case of using $N_2$ and $H_2$ gases. As can be noted from Table 5, the DZ is barely formed in the $N_2$ atmosphere.

Figure 22A:
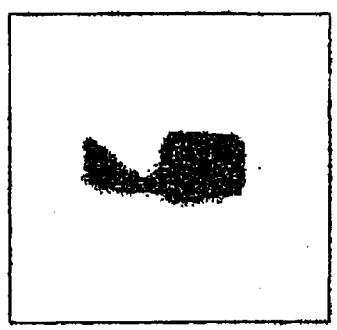
FIG. 22A is a photograph showing the shape of a COP in an as-grown state and FIG. 22B shows the shape of COP that has been changed after an RTA process according to embodiments of the invention in the $N_2$ gas atmosphere.
Figure 22B:
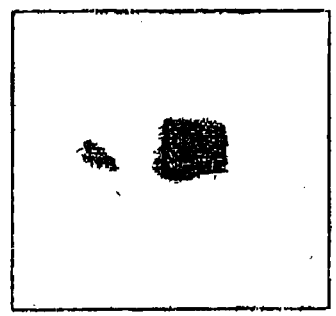
Figure 23A:
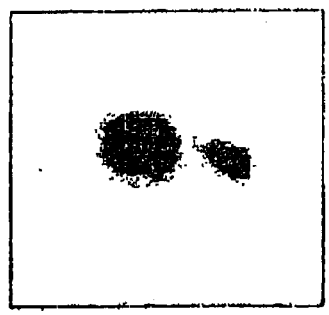
FIG. 23A is a photograph showing the shape of a COP in an as-grown state and FIG. 23B shows the shape of COP that has been changed after an RTA process according to embodiments of the invention in the $N_2$ gas and Ar gas atmosphere.
Figure 23B:
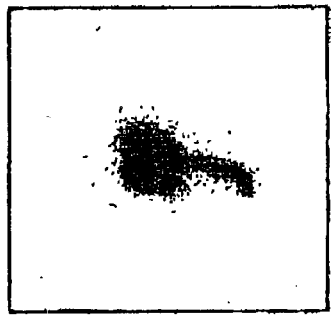
Figure 24A:
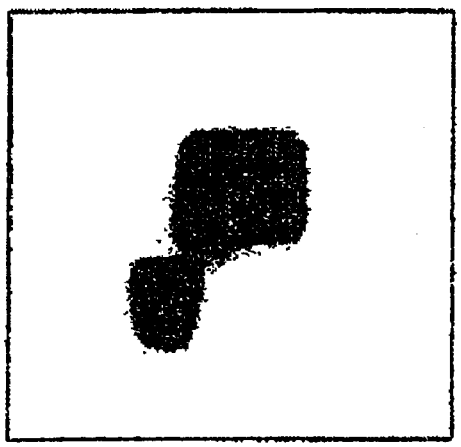
FIG. 24A is a photograph showing the shape of a COP in an as-grown state and FIG. 24B shows the shape of COP that has been changed after an RTA process according to embodiments of the invention in the $N_2$ gas and $H_2$ gas atmosphere.
Figure 24B:
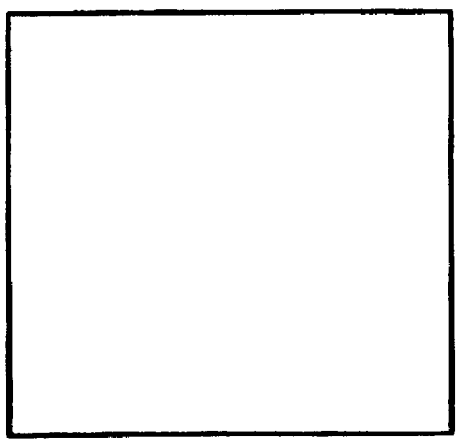

FIGS. 22A through 24B are photographs showing the shapes of as-grown COPs, and those of COPs that have been changed, after the RTA of FIG. 5. In particular, FIGS. 22A and 22B represent the cases where RTA is performed in the $N_2$ atmosphere, FIGS. 23A and 23B represent the cases where RTA is performed in the $N_2$ and Ar atmosphere, and FIGS. 24A and 24B represent the cases where the $N_2$ and $H_2$ atmosphere. As shown in Table 5, the COPs are not substantially dissolved in the $N_2$ atmosphere. Also, the dissolution of the COPs is smooth in a gas mixture atmosphere where the $N_2$ gas is mixed with Ar or $H_2$ gas, and in particularly, the COPs can be completely dissolved in the $H_2$ atmosphere. From this result, it can also be inferred that reducing the sizes of COPs in the as-grown state can assist in completely dissolving the COPs during the RTA process of FIG. 5.

Embodiments of the present invention can control the distribution of the oxygen precipitates formed via subsequent thermal process cycles, which are usually performed in semiconductor device fabrication, by performing the RTA process of FIG. 5 on a silicon wafer. Embodiments of overall wafer preparation during which the RTA process according to the present invention is carried out, and preparation of wafers which are effective in applying the RTA, now will be described.

Figure 25:
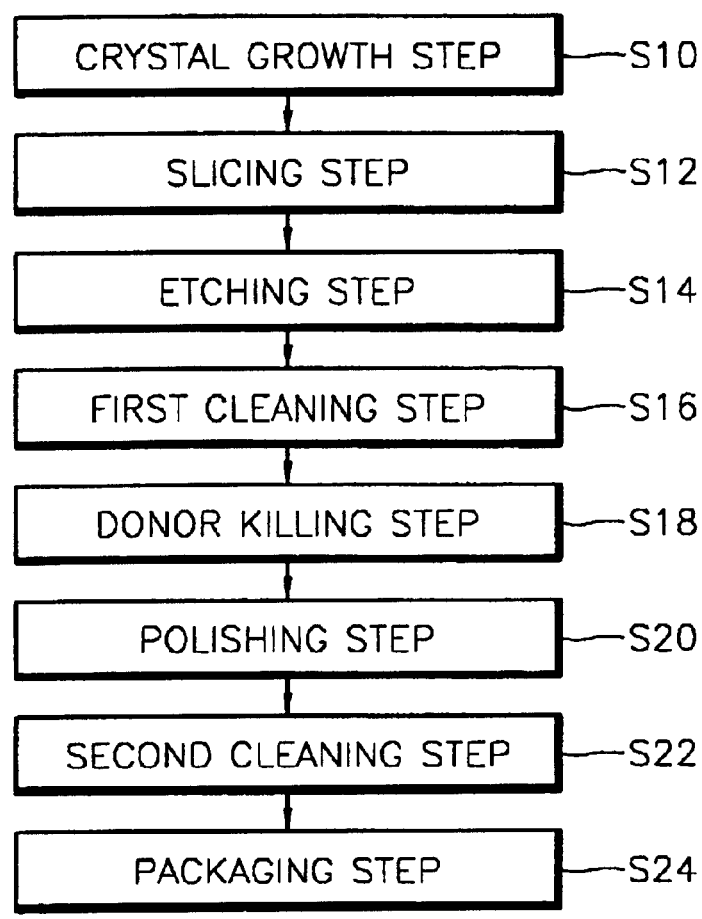
FIG. 25 is a flow diagram illustrating preparation of wafers according to embodiments of the present invention.

FIG. 25 is a flow diagram illustrating preparation of wafers according to a embodiments of the present invention, and particularly, illustrating a general wafering process after crystal growth (S10). An overview of the general wafering technique is provided in Chapter 1 of the textbook "Silicon Processing for the VLSI Era, Volume 1, Process Technology", by S. Wolf and R. N. Tauber, 1986, pp. 1–35, the disclosure of which is hereby incorporated herein by reference. Referring to FIG. 25, the general wafering process includes the crystal growth step (S10) of growing an ingot using a CZ puller, a slicing step (S12) of slicing the ingot into wafers, an etching step (S14) of rounding the edge of each slice or etching the surfaces of slices. Then, after a first cleaning step (S16) of cleaning the surfaces of slices, a donor killing step (S18) is carried out, and the top surfaces of the wafers, where semiconductor devices are formed, are polished (S20), and the polished wafers are cleaned in a second cleaning step (S22). Then, the resultant wafers are packaged (S24).

RTA of FIG. 5 according to embodiments of the present invention is performed in the donor killing step (S18). RTA according to other embodiments of the present invention can be carried out in a separate step. However, it may be preferable to perform the RTA in the donor killing step (S18) in view of costs. In general, donor killing refers to a process of converting oxygen component contained in the silicon ingot, which are present in the form of ions during subsequent semiconductor device fabrication and act as a donor of electrons to implanted impurity ions, into oxygen precipitates via heat treatment during the wafering process in order to reduce the possibility of functioning as donor. This heat treatment is carried out at about 700° C. for about 30 seconds or more in an RTA furnace.

Figure 27:
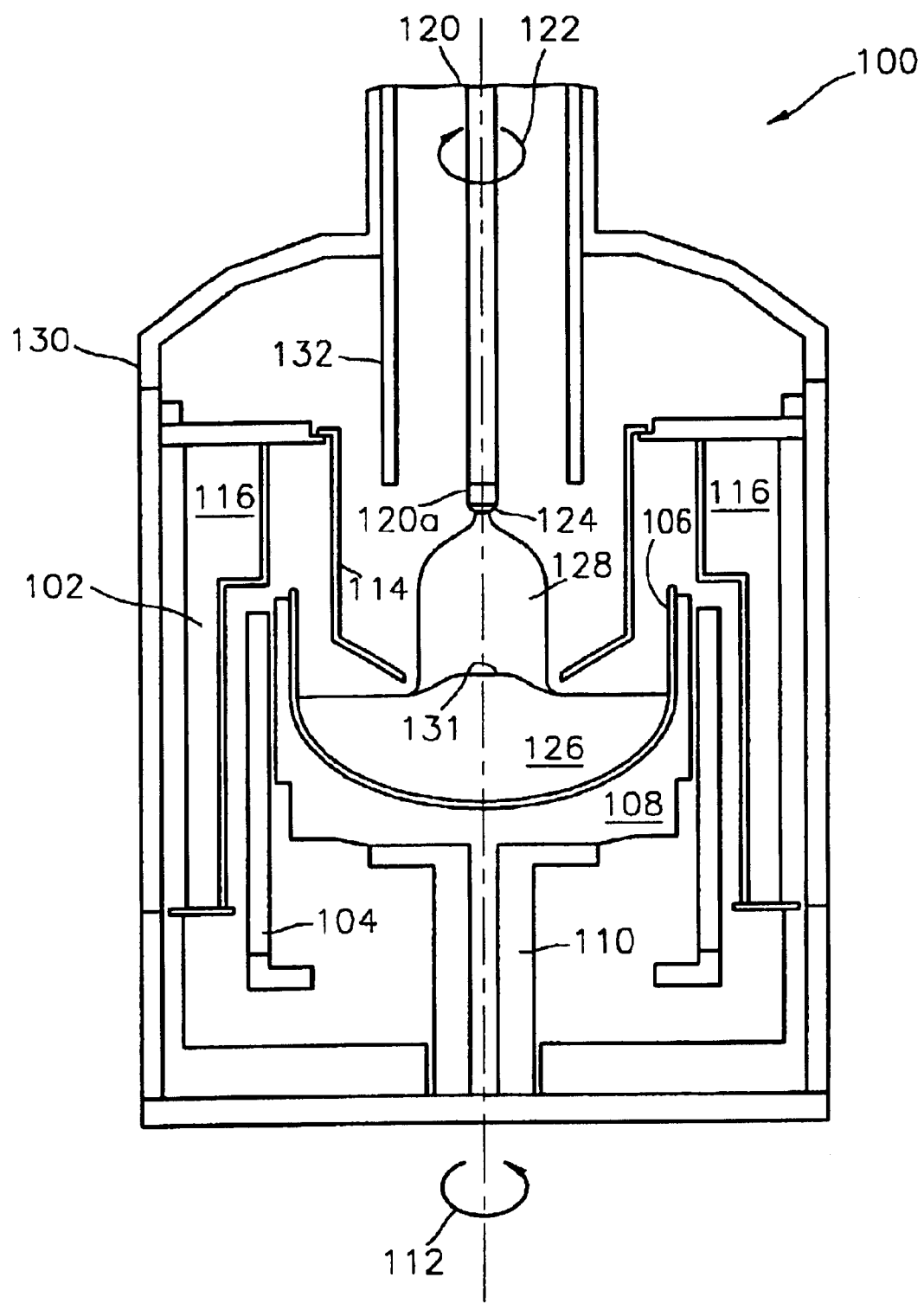
FIG. 27 is a schematic view illustrating a conventional Czochralski (CZ) puller.

FIG. 27 is a schematic view of a conventional CZ puller, in which the crystal growth (S10) is performed. As shown in FIG. 27, the CZ puller 100 includes a furnace, a crystal pulling mechanism, an environment controller and a computer-based control system. The CZ furnace is generally referred to as a hot zone furnace. The hot zone furnace includes a heater 104, a crucible 106 which may be made of quartz, a succeptor 108 which may be made of graphite and a rotation shaft 110 that rotates about an axis in a first direction 112 as shown.

A cooling jacket or port 132 is cooled by external cooling means such as water cooling. A heat shield 114 may provide additional thermal distribution. A heat pack 102 is filled with a heat absorbing material 116 to provide additional thermal distribution.

The crystal pulling mechanism includes a crystal pulling shaft 120 which may rotate about the axis in a second direction 122, opposite to the first direction 112, as shown. The crystal pulling shaft 120 includes a seed holder 120a at the end thereof. The seed holder 120a holds a seed crystal 124, which is pulled from a molten silicon 126 in the crucible 106 to form an ingot 128.

The environment control system may include a chamber enclosure 130, the cooling jacket 132, and other flow controllers and vacuum exhaust systems that are not shown. The computer-based control system may be used to control the heating elements, the puller and other electrical and mechanical elements.

In order to grow a monocrystalline silicon ingot, the seed crystal 124 is contacted to the molten silicon 126 and is gradually pulled in the axial direction (upwards). Cooling and solidification of the molten silicon 126 into monocrystalline silicon occurs at the interface 131 between the ingot 128 and the molten silicon 126. As shown in FIG. 27, the interface 131 is concave relative to the molten silicon 126.

A controlled oxygen precipitate concentration profile as shown in FIG. 4 can be obtained from at least three types of silicon wafers, through embodiments of RTA according to the present invention. Specifically, RTA according to embodiments of the present invention can be applied to a "perfect" wafer in which no defects such as interstitial agglomerates and vacancy agglomerates exist; a "semi-perfect" wafer in which vacancy agglomerates are present in only a vacancy-rich region within a predetermined radius from the center of the wafer, and no vacancy agglomerates and interstitial agglomerates are present outside the vacancy-rich region; and a wafer which contains only vacancy agglomerates through the wafer, without interstitial agglomerates. However, the present invention is not limited to the above wafers, and includes all types of wafers to which the principle of the present invention can be applied. As described above, embodiments of the present invention are directed to the controlled oxygen precipitate concentration profile as shown in FIG. 4, which can be achieved by performing an RTA process of FIG. 5 and the subsequent heat treatment of a silicon wafer to which the present invention can be applied. Also, as for the COPs, embodiments of the present invention provide a wafer in which COPs are present in only the bulk region of the wafer and not present in the DZs.

In order to prevent the defects of silicon wafers, many practical investigations have focused on a crystal growth process for a high-purity ingot. For example, it is widely known that the pull rate of the seed crystal and the temperature gradients in the hot zone structure should be controlled. The control of the pull rate (V) of the ingot and the temperature gradients (G) of the ingot-molten silicon interface are described in detail in "The Mechanism of Swirl Defects Formation in Silicon" by Voronkov, Journal of Crystal Growth, Vol. 59, 1982, pp. 625–643. Also, an application of Voronkov's Theory may be found in a publication by the present inventor et al. entitled "Effect of Crystal Defects on Device Characteristics", Proceedings of the Second International Symposium on Advanced Science and Technology of Silicon Material, Nov. 25–29, 1996, p. 519. This publication discloses that when the ratio of V to G (referred to as V/G ratio) is below a critical ratio (V/G)*, an interstitial-rich region is formed, while when V/G ratios is above the critical ratio (V/G)*, a vacancy-rich region is formed.

Figure 26:
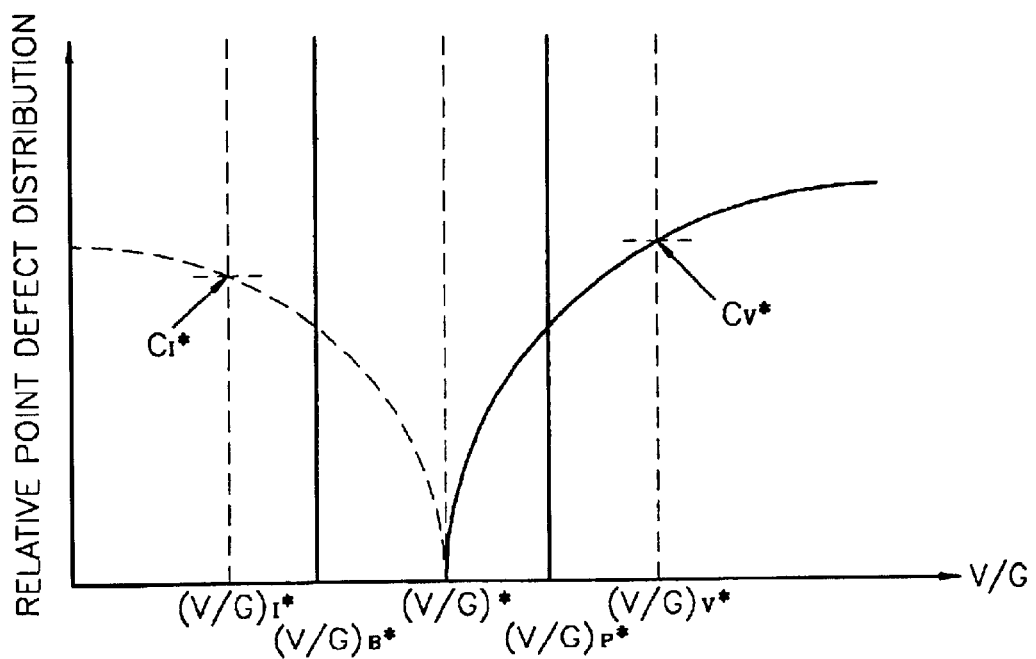
FIG. 26 is a conceptual diagram illustrating a relationship between a relative point defect distribution in a silicon ingot, and the V/G ratio (the pull rate of the ingot/the temperature gradient).

In particular, FIG. 26 is a conceptual view illustrating the relationship between a relative point defect distribution in a silicon ingot and the V/G ratio. As shown in FIG. 26, during ingot growth, for a V/G ratio above a critical V/G ratio (V/G)*, a vacancy-rich region is formed. Also, for a V/G ratio where the vacancy concentration is above a critical vacancy concentration $C_v^*$, vacancy agglomerates are formed, while for a V/G ratio where the interstitial concentration is above a critical interstitial concentration $C_I^*$, interstitial agglomerates are formed. Also, in FIG. 26, $(V/G)_B^*$ represents a B-band, which is a ring associated with interstitial silicon, and $(V/G)_P^*$ represents a P-band which is an O.S.F. ring.

Embodiments of the present invention can be applied to a perfect wafer without defects, which has a V/G ratio between the B-band and P-band during the ingot growth, a semi-perfect wafer which has a V/G ratio within the B-band, and a wafer where vacancy agglomerates are formed through the wafer due to the V/G ratio above the critical V/G ratio $(V/G)_v^*$ corresponding to the critical vacancy concentration $C_v^*$.

Perfect wafers and semi-perfect wafers, which are applicable to the present invention, are described in detail in U.S. application Ser. No. 08/989,591 and continuation-in-parts thereof, U.S. Application Nos. 09/320,210 and 09/320,102, that were incorporated herein by reference. Thus, a detailed description thereof will be omitted.

Figure 28:
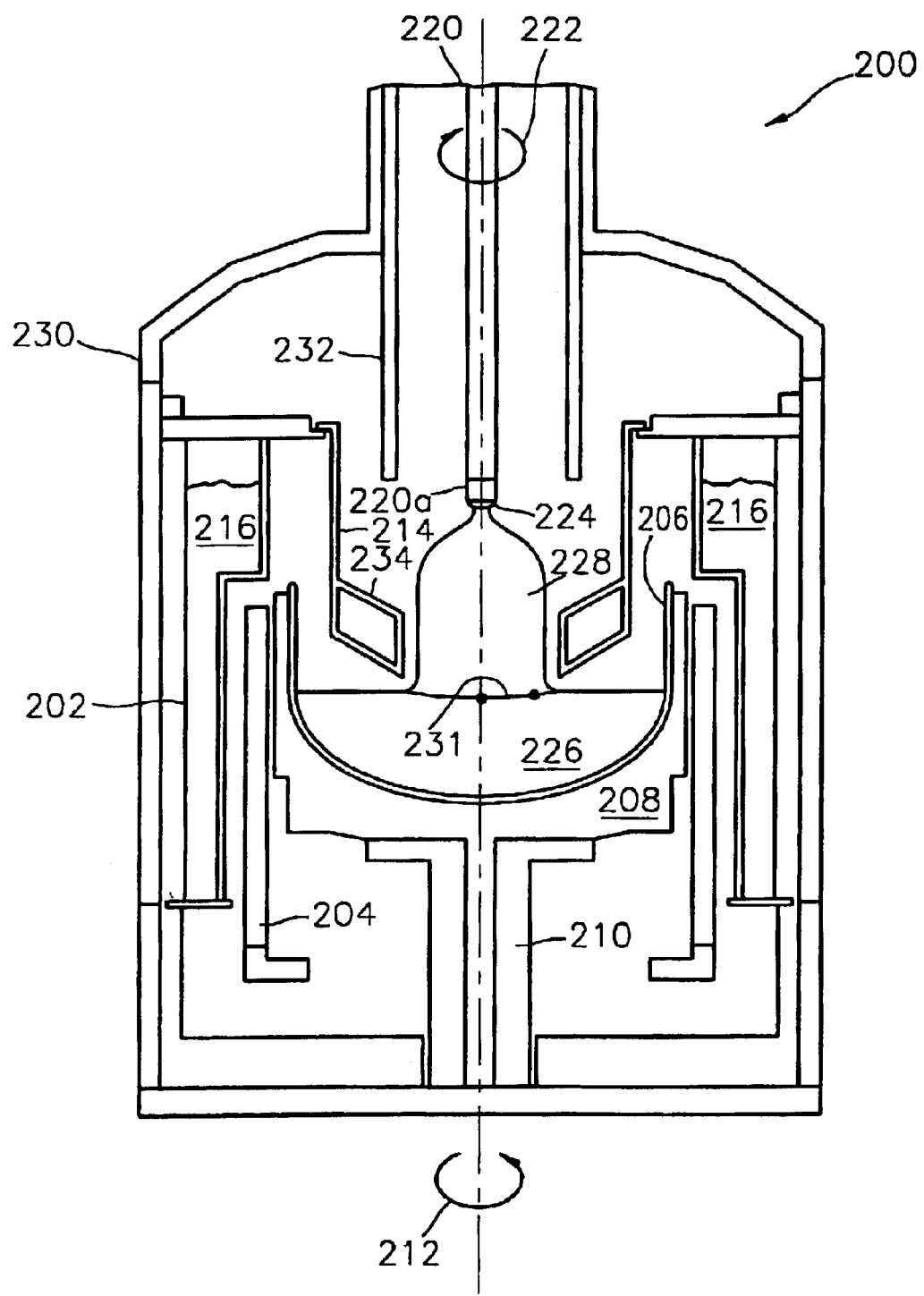
FIG. 28 is a schematic view of another conventional CZ puller according to application Ser. Nos. 09/989,591 and 09/320,210.

FIG. 28 is a schematic view of a modified CZ puller disclosed in the continuation-in-part applications, in which a heat shield 214 is modified compared to the CZ puller shown in FIG. 27. Briefly, as shown in FIG. 28, the modified CZ puller 200 includes a furnace, a crystal pulling mechanism, an environment controller and a computer-based control system. The hot zone furnace includes a heater 204, a crucible 206, a succeptor 208 and a rotation shaft 210 that rotates about an axis in a first direction 212 as shown. A cooling jacket 232 and a heat shield 214 may provide additional thermal distribution, and a heat pack 202 contains a heat absorbing material 216 to provide additional thermal distribution.

The crystal pulling mechanism includes a crystal pulling shaft 220 which may rotate about the axis in a second direction 222, opposite to the first direction 212, as shown. The crystal pulling shaft 220 includes a seed holder 220a at the end thereof. The seed holder 220a holds a seed crystal 224 which is pulled from molten silicon in the crucible 206 to form an ingot 228.

The environment control system may include a chamber enclosure 230, the cooling jacket 232 and other flow controllers and vacuum exhaust systems that are not shown. The computer-based control system may be used to control the heating elements, the puller and other electrical and mechanical elements.

In order to grow a monocrystalline silicon ingot, the seed crystal 224 is contacted to the molten silicon 226 and is gradually pulled in the axial direction (upwards). Cooling and solidification of the molten silicon 226 into monocrystalline silicon occurs at the interface 231 between the ingot 228 and the molten silicon 226. In contrast to the CZ puller of FIG. 27, the CZ puller 200 of FIG. 28 further includes a heat shield housing 234 in the heat shield 214, which permits more accurate control of the V/G ratio.

Figure 29:
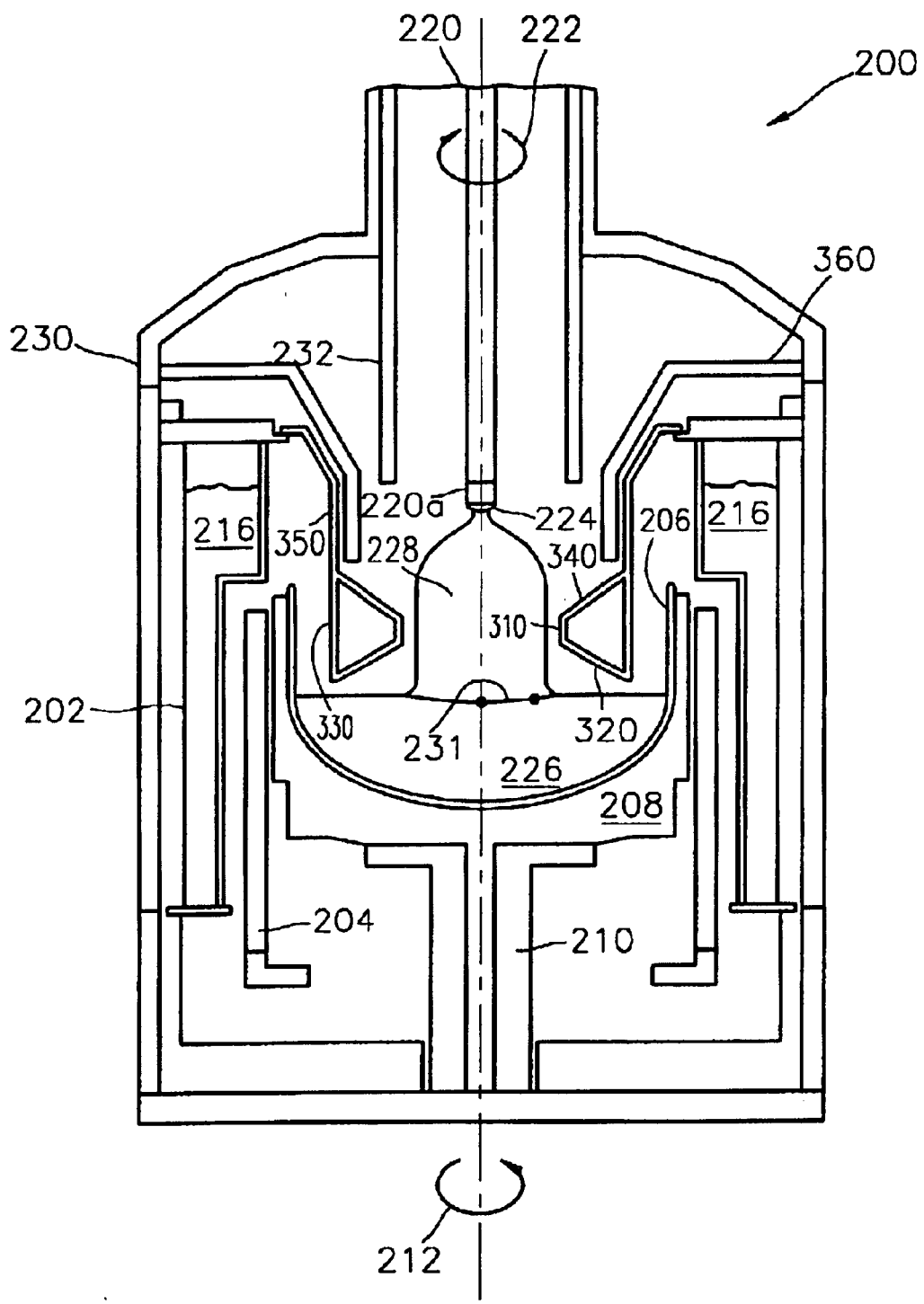
FIG. 29 is a schematic view illustrating CZ pullers according to embodiments of the present invention.
Figure 30:
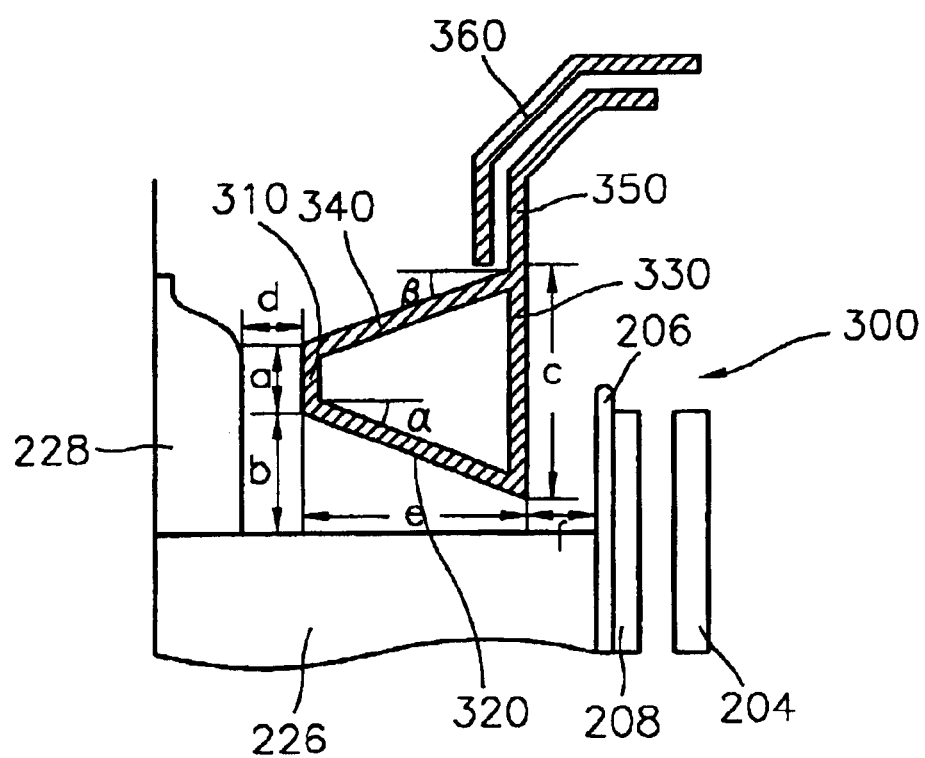
FIG. 30 is a diagram showing major parts of CZ pullers of FIG. 29.

FIG. 29 is a schematic view of a modified CZ puller according to embodiments of the present invention, and FIG. 30 illustrates details of modified parts of the CZ puller of FIG. 29. In FIGS. 29 and 30, like reference numerals used in FIG. 28 are used to refer to like elements, and only the differences from the CZ puller of FIG. 28 will be described. As shown in FIGS. 29 and 30, the changes from the CZ puller of FIG. 28 include the shape of a heat shield housing 300 and additional installation of a heat shield plate 360. The heat shielding housing 300, which has a 90°-rotated trapezoid shape, like a ring, includes an inner heat shield housing wall 310 and an outer heat shield housing wall 330, which preferably are vertical, and a heat shield housing top 340 and a heat shield housing bottom 320 which connect the inner and outer heat shield housing walls 310 and 330. Here, the heat shield housing top 340 slopes upwards at an angle of β from the horizontal from the inner heat shield housing wall 310 to the outer heat shield housing wall 330, while the heat shield housing bottom 320 slopes downwards at an angle of α from the horizontal from the inner heat shield housing wall 310 to the outer heat shield housing wall 330, forming the trapezoid shape as shown.

The ring-shaped heat shield housing 300 may be filled with a heat absorbing material (not shown), and may be formed of carbon ferrite.

Also, the heat shield housing 300 is fixed to the top of the heat pack 202 by a support member 350. The heat shield plate 360 is disposed between the heat shield housing top 340 of the heat shield housing 300 and the cooling jacket 232, around the ingot being pulled.

The configuration of the CZ puller shown in FIGS. 29 and 30 can allow the cooling rate of the ingot to increase. The size of voids, which are present in the pulled ingot, is generally proportional to the square root of the initial vacancy concentration at the ingot-molten silicon interface, but inversely proportional to the square root of the cooling rate of the ingot. As described with reference to FIG. 11, as long as the size of voids present in the ingot, which are formed during the crystal growth, is smaller than a predetermined size, although the pulled ingot contains voids, the voids can be dissolved from the DZ through the RTA process according to embodiments of the present invention.

Thus, in order to reduce the size of voids in the ingot, which is desirable according to embodiments of the present invention, the cooling rate of the ingot may be increased. As the cooling rate of the ingot increases, a temperature gradient Gc at the center of the ingot may increase. Therefore, if the V/G ratio is constant for a predetermined defect distribution, the pulling rate of the ingot (V) should be increased.

According to embodiments of the present invention, in order to increase the cooling rate of the ingot to at least 1.4° K./min or more based on the temperature of the ingot at the center thereof, to cool the ingot from the temperature at the ingot-molten silicon interface to a predetermined temperature of the ingot, at least one of the length a of the inner heat shield housing wall 310, the length c of the outer heat shield housing wall 330, the angle β of the heat shield housing top 340, the angle α of the heat shield housing bottom 320, the distance d between the ingot 228 and the inner heat shield housing wall 310, the distance f between the crucible 206 and the outer heat shield housing wall 330, the distance e between the inner and outer heat shield housing walls 310 and 330, the distance b between the inner heat shield housing wall 310 and the molten silicon 226, and the position of the heat shield plate 360 can be varied.

In the CZ puller of FIG. 29, due to the high cooling rate of the pulled ingot, the pulling rate of the ingot can be increased, for example, in the range of 0.50 to 1.00 mm/min, so that the productivity of the ingot can increase. In addition, a processing margin for perfect wafers or semi-perfect wafers, which are manufactured by the CZ puller of FIG. 28, can be provided for the growth of the ingot.

In the drawings and specification, there have been disclosed typical preferred embodiments of the invention and, although specific terms are employed; they are used in a generic and descriptive sense only and not for purposes of limitation, the scope of the invention being set forth in the following claims.

What is claimed is:

1. A Czochralski puller for growing monocrystalline silicon ingots, comprising:

a chamber enclosure;

a crucible in the chamber enclosure that holds molten silicon;

a seed holder in the chamber enclosure, adjacent the crucible to hold a seed crystal;

a heater in the chamber enclosure, surrounding the crucible;

a ring-shaped heat shield housing in the chamber enclosure, including inner and outer heat shield housing walls that are separated from one another, and a heat shield housing top and a heat shield housing bottom which connect the inner and outer heat shield housing walls, the heat shield housing top sloping upwards from the inner heat shield housing wall to the outer heat shield housing wall, and the heat shield housing bottom sloping downwards from the inner heat shield housing wall to the outer heat shield housing wall; and a support member that supports the heat shield housing within the crucible.

2. The Czochralski puller of claim 1, wherein the ring-shaped heat shield housing is filled with a heat absorbing material.

3. The Czochralski puller of claim 1, further comprising a cooling jacket between the heat shield and the seed holder.

4. The Czochralski puller of claim 3, further comprising a heat shield plate which surrounds the ingot being pulled, between the heat shield housing and the cooling jacket.

5. The Czochralski puller of claim 4, wherein the puller further is configured to pull the seed holder from the crucible to grow the molten silicon into the cylindrical monocrystalline silicon ingot, which grows in a cylindrical shape and forms an ingot-molten silicon interface with the molten silicon; at least one of the lengths of the inner and outer heat shield housing walls of the heat shield housing, the slope angles of the heat shield housing top and bottom, the distance between the ingot and the inner heat shield housing wall, the distance between the crucible and the outer heat shield housing wall, the distance between the molten silicon and the inner heat shield housing wall and the location of the heat shield plate being selected such that the pulled ingot is cooled at a rate of at least about 1.4° K./min based on the temperature of the ingot at the center thereof, from the temperature at the ingot-molten silicon interface to a predetermined temperature of the ingot.

6. The Czochralski puller of claim 1, wherein the heat shield housing is formed of carbon ferrite.

* * * * *